United States Patent
Lee

(10) Patent No.: US 9,666,798 B1
(45) Date of Patent: May 30, 2017

(54) SWITCHING ELEMENTS, RESISTIVE RANDOM ACCESS MEMORY DEVICES INCLUDING THE SAME, AND METHODS OF MANUFACTURING THE SWITCHING ELEMENTS AND THE RESISTIVE RANDOM ACCESS MEMORY DEVICES

(71) Applicant: SK hynix Inc., Icheon (KR)

(72) Inventor: Jae Yeon Lee, Gunpo (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/206,076

(22) Filed: Jul. 8, 2016

(30) Foreign Application Priority Data

Feb. 2, 2016 (KR) ........................ 10-2016-0013129

(51) Int. Cl.
*H01L 45/00* (2006.01)

(52) U.S. Cl.
CPC .......... *H01L 45/1253* (2013.01); *H01L 45/10* (2013.01); *H01L 45/1233* (2013.01); *H01L 45/145* (2013.01); *H01L 45/1641* (2013.01)

(58) Field of Classification Search
CPC .................................................. H01L 45/1253
See application file for complete search history.

(56) References Cited

U.S. PATENT DOCUMENTS

| | | | | |
|---|---|---|---|---|
| 8,852,996 | B2 * | 10/2014 | Wang | H01L 45/08 257/2 |
| 9,246,087 | B1 * | 1/2016 | Wang | H01L 45/12 |
| 9,246,094 | B2 * | 1/2016 | Wang | H01L 45/08 |
| 9,340,873 | B2 * | 5/2016 | Saito | C23C 16/45534 |
| 2012/0176831 | A1 * | 7/2012 | Xiao | G11C 13/0007 365/148 |
| 2014/0035018 | A1 | 2/2014 | Lee | |
| 2014/0103284 | A1 * | 4/2014 | Hsueh | H01L 45/1608 257/4 |
| 2014/0175355 | A1 * | 6/2014 | Wang | H01L 45/08 257/2 |
| 2014/0175364 | A1 * | 6/2014 | Wang | H01L 45/1253 257/4 |
| 2014/0192586 | A1 * | 7/2014 | Nardi | H01L 45/06 365/148 |
| 2015/0194380 | A1 * | 7/2015 | Takaki | H01L 23/50 257/4 |
| 2015/0279850 | A1 * | 10/2015 | Takaki | H01L 27/11524 257/369 |

FOREIGN PATENT DOCUMENTS

KR   10-2012-0048818 A   5/2012

* cited by examiner

*Primary Examiner* — Calvin Choi
*Assistant Examiner* — S. M. S Imtiaz

(57) ABSTRACT

A method of manufacturing a switching element is provided. The method includes forming a pillar-shaped structure having a first electrode, an insulation layer and a second electrode which are stacked on a substrate. A tilted doping process is performed to inject dopants into at least a portion of the insulation layer. The tilted doping process forms a threshold switching operation region in the insulation layer.

13 Claims, 54 Drawing Sheets

SWITCHING ELEMENTS, RESISTIVE RANDOM ACCESS MEMORY DEVICES INCLUDING THE SAME, AND METHODS OF MANUFACTURING THE SWITCHING ELEMENTS AND THE RESISTIVE RANDOM ACCESS MEMORY DEVICES

CROSS-REFERENCE TO RELATED APPLICATIONS

The present application claims priority under 35 U.S.C 119(a) to Korean Patent Application No. 10-2016-0013129, filed on Feb. 2, 2016, which is herein incorporated by references in its entirety.

BACKGROUND

1. Technical Field

Embodiments of the present disclosure relate to switching elements used in semiconductor devices and, more particularly, to switching elements, resistive random access memory (ReRAM) devices including the same, and methods of manufacturing the switching elements and the ReRAM devices.

2. Related Art

A cross-point cell array structure has been employed in cell array regions of highly integrated semiconductor devices such as resistive random access memory (ReRAM) devices, phase change random access memory (PcRAM) devices, or magnetic random access memory (MRAM) devices. The cross-point cell array structure may include a plurality of pillar-shaped cells which are disposed at cross points, where lower electrodes intersect upper electrodes.

In the event that the cross-point cell array structure is employed in a semiconductor device, an undesired sneak current may flow in a cell array region of the semiconductor device, which causes write errors during a write operation or read errors during a read operation. In order to prevent the write errors or the read errors from occurring due to the undesired sneak current, a selection element may be additionally employed in each memory cell of the semiconductor device. A switching element such as a transistor, a diode, a tunnel barrier device, or an ovonic threshold switch has been used as the selection element.

SUMMARY

Various embodiments are directed to switching elements having a pillar-shaped structure, ReRAM devices employing the switching elements as selection elements of memory cells, and methods of manufacturing the switching elements and the ReRAM devices.

According to an embodiment, there is provided a method of manufacturing a switching element. The method includes forming a pillar-shaped structure on a substrate. The pillar-shaped structure is formed to include a first electrode, an insulation layer and a second electrode which are stacked on a substrate. A tilted doping process is performed to inject dopants into at least a portion of the insulation layer. The tilted doping process forms a threshold switching operation region in the insulation layer.

According to another embodiment, a switching element includes a pillar-shaped structure having a first electrode, an insulation layer and a second electrode. A threshold switching operation region is disposed in the insulation layer. The threshold switching operation region includes dopants and extends from a sidewall of the insulation layer to an inside region of the insulation layer. A size of the threshold switching operation region is controlled by controlling a size of a distribution region of the dopants.

According to another embodiment, there is provided a method of manufacturing a resistive random access memory (ReRAM) device. The method includes forming an array of pillar-shaped structures on a substrate. Each of the pillar-shaped structures includes a lower electrode, a resistive memory layer pattern, a middle electrode, an insulation layer pattern and an upper electrode which are sequentially stacked. A tilted doping process is performed to inject dopants into at least a portion of the insulation layer pattern of each of the pillar-shaped structures. The tilted doping process is performed to form a threshold switching operation region in the insulation layer pattern of each of the pillar-shaped structures. A size of the threshold switching operation region is controlled by controlling a size of a distribution area containing the dopants injected into the insulation layer pattern during the tilted doping process.

According to another embodiment, there is provided a method of manufacturing a resistive random access memory (ReRAM) device. The method includes forming an array of pillar-shaped structures on a substrate. Each of the pillar-shaped structures is includes a lower electrode, an insulation layer pattern, a middle electrode, a resistive memory layer pattern and an upper electrode which are sequentially stacked, and a plurality of spacers covering sidewalls of the resistive memory layer pattern of the pillar-shaped structure. A tilted doping process is performed to inject dopants into a portion of the insulation layer pattern of each of the pillar-shaped structures. The tilted doping process forms a threshold switching operation region in the insulation layer pattern of each of the pillar-shaped structures, and a size of the threshold switching operation region is controlled by controlling a size of a distribution region containing the dopants injected into the insulation layer pattern.

According to another embodiment, a resistive random access memory (ReRAM) device includes a pillar-shaped structure having a lower electrode, a resistive memory layer pattern, a middle electrode, an insulation layer pattern and an upper electrode which are sequentially stacked. A threshold switching operation region is disposed in the insulation layer pattern to extend from a sidewall of the insulation layer pattern into an inside region of the insulation layer pattern. The threshold switching operation region includes dopants. A size of the threshold switching operation region corresponds to a size of a distribution region containing the dopants.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1A:
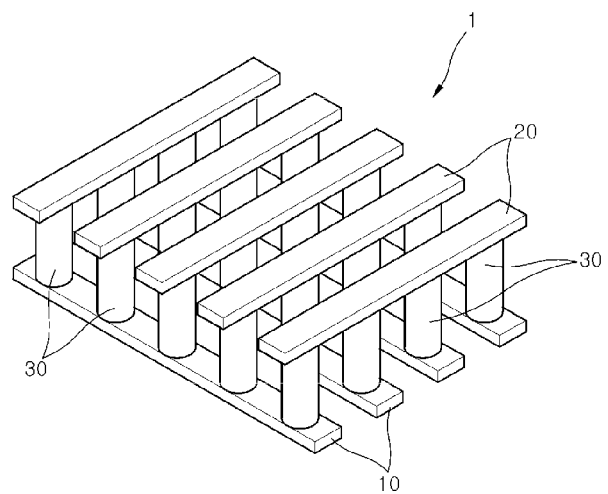
FIG. 1A is a perspective view illustrating a cross-point array device according to an embodiment.

Various embodiments will now be described more fully hereinafter with reference to the accompanying drawings. In the drawing figures, the dimensions of layers and regions may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that when an element is referred to as being "on," "above", "below," or "under" another element, it can be directly "on," "above", "below," or "under" the other element, respectively, or intervening elements may also be present. Like reference numerals refer to like elements throughout.

As used herein, the singular terms "a," "an," and "the" are intended to include the plural forms as well, unless the context clearly indicates otherwise. It will be further understood that the terms "comprise," "comprising," "includes," "including," "have," "having," and variants thereof specify the presence of stated features, integers, steps, operations, elements, and/or components, but do not preclude the presence and/or addition of one or more other features, integers, steps, operations, elements, components, and/or groups thereof.

According to the following embodiments, switching elements performing a threshold switching operation may be provided. The term "threshold switching operation" described herein means an operation in which a switching element is sequentially turned on and off while an external voltage is applied to the switching element. In a threshold switching operation, an absolute value of the external voltage may gradually increase or decrease. When the absolute value of the external voltage applied to the switching element increases, the switching element may be turned on, thereby nonlinearly increasing an operation current. That is, the switching element is turned on when the absolute value of the external voltage is greater than an absolute value of a first threshold voltage. When the absolute value of the external voltage applied to the switching element is reduced after the switching element has been turned on, the switching element may be turned off, thereby nonlinearly decreasing the operation current. That is, the switching element is turned off when the absolute value of the external voltage is less than an absolute value of a second threshold voltage. As such, the switching element performing the threshold switching operation may have a non-memory characteristic.

Figure 1B:
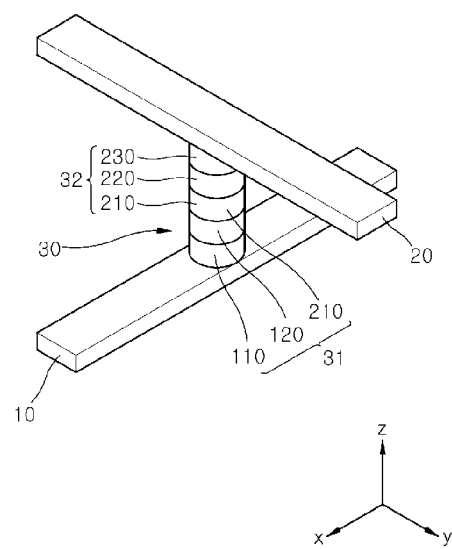
FIG. 1B is an enlarged view illustrating a portion of the cross-point array device shown in FIG. 1.

FIG. 1A is a perspective view illustrating a cross-point array device 1 according to an embodiment, and FIG. 1B is an enlarged view illustrating a portion of the cross-point array device 1 shown in FIG. 1.

Referring to FIG. 1A, the cross-point array device 1 may include first conductive lines 10 extending in an X-axis direction; second conductive lines 20 extending in a Y-axis direction and intersecting the first conductive lines 10; and pillar-shaped structures 30 disposed at overlap regions between the first conductive lines 10 and the second conductive lines 20, and extending in a Z-axis direction. The pillar-shaped structures 30 may be two-dimensionally arrayed along the X-axis direction and the Y-axis direction.

Although FIG. 1 illustrates an example in which a rectangular coordinate system is used, the present disclosure is not limited to the rectangular coordinate system. For example, in some embodiments, any one of various non-rectangular coordinate systems may be used to describe the cross-point array device 1. In such a non-rectangular coordinate system, the X-axis and the Y-axis may intersect each other at a non-right angle.

Referring to FIG. 1B, each of the pillar-shaped structures 30 may include a variable resistive element 31 and a selection element 32. The variable resistive element 31 may include a lower electrode 110, a resistive memory layer 120, and a middle electrode 210. The selection element 32 may include the middle electrode 210, an insulation layer 220, and an upper electrode 230. The variable resistive element 31 may share the middle electrode 210 with the selection element 32. Accordingly, the cross-point array device 1 illustrated in FIGS. 1A and 1B may function as a ReRAM device that includes a plurality of memory cells. Each of the memory cells may be comprised of the variable resistive element 31 and the selection element 32.

The ReRAM device may correspond to a memory device that discriminates information, stored in a selected one of the pillar-shaped structures 30 disposed between the first conductive lines 10 and the second conductive lines 20, based on an amount of current flowing through the selected pillar-shaped structure 30.

Herein, the meaning of the term "ReRAM device" may be expanded, such that the ReRAM device of the present embodiment may also include a PcRAM device or an MRAM device. In such a case, the variable resistive element 31 may have a memory characteristic that depends on an electrical resistance value of the variable resistance element 31. In contrast, the selection element 32 may have a non-memory characteristic that depends on a threshold switching operation of the selection element 32.

In the variable resistive element 31, each of the lower electrode 110 and the middle electrode 210 may include a metal material, a conductive nitride material, or a conductive oxide material. In some embodiments, each of the lower electrode 110 and the middle electrode 210 may include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), or ruthenium oxide ($RuO_2$).

In the variable resistive element 31, the resistive memory layer 120 may include a material having a high resistive state or a low resistive state according to a magnitude or a polarity of a voltage applied across the resistive memory layer 120. In some embodiments, the resistive memory layer 120 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material. In other embodiments, the resistive memory layer 120 may include a perovskite material such as a praseodymium calcium manganese oxide ($Pr_{0.7}Ca_{0.3}MnO_3$) material, a $La_{1-x}Ca_x$-$MnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a $(Ba,Sr)TiO_3$(Cr,Nb-doped) material, a $SrZrO_3$(Cr,V-doped) material, a $(La,Sr)MnO_3$ material, a $Sr_{1-x}La_xTiO_3$ material, a $La_{1-x}Sr_xFeO_3$ material, a $La_{1-x}Sr_xCoO_3$ material, a $SrFeO_{2.7}$ material, a $LaCoO_3$ material, a $RuSr_2GdCu_2O_3$ material, or a $YBa_2Cu_3O_7$ material. In yet other embodiments, the resistive memory layer 120 may include a metal sulfide material, for example, an $Ag_2S$ material, a $Cu_2S$ material, a CdS material, or a ZnS material. In still other embodiments, the resistive memory layer 120 may include a selenide material such as a $Ge_xSe_{1-x}$(Ag,Cu,Te-doped).

The selection element 32 may be electrically connected to the variable resistive element 31 in series. The selection element 32 may suppress the occurrence of a sneak current between adjacent pillar-shaped structures 30 when the cross-point array device 1 operates. In some embodiments, an amount of the sneak current may be proportional to an amount of off-current of the selection element 32 when the selection element 32 is in an off state.

The insulation layer 220 in the selection element 32 may include a silicon oxide material, a silicon nitride material, a metal oxide material, a metal nitride material, or a combination containing at least two materials thereof. For example, the insulation layer 220 may include an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, or an iron oxide material. The insulation layer 220 may include a compound material having a nonstoichiometric composition. The insulation layer 220 may have an amorphous structure.

At least a portion of the insulation layer 220 employed in the selection element 32 may include a threshold switching operation region, which is doped with dopants. For example, the dopants may include N-type dopants or P-type dopants. For another example, the dopants may not show an N-typed or a P-typed electrical property in the threshold switching operation region. A size of the threshold switching operation region may be controlled by a distribution region of the dopants in the insulation layer 220. A threshold switching operation of the selection element 32 may be performed by the threshold switching operation region.

In some embodiments, the dopants injected into the insulation layer 220 may have an atomic value that is different from an atomic value of silicon atoms or metal atoms constituting the insulation layer 220. Thus, the dopants in the insulation layer 220 may form trap sites for conductive carriers moving through the insulation layer 220. During a threshold switching operation, the trap sites may capture or conduct the conductive carriers moving in the insulation layer 220 between the middle electrode 210 and the upper electrode 230 according to an external voltage applied to the insulation layer 220.

If the insulation layer 220 includes a silicon oxide material or a silicon nitride material, the dopants injected into the insulation layer 220 may include at least one selected from aluminum (Al), lanthanum (La), niobium (Nb), vanadium (V), tantalum (Ta), tungsten (W), chrome (Cr), and molybdenum (Mo). Specifically, if the insulation layer 220 includes a silicon oxide material, then aluminum (Al) or lanthanum (La) may be used as the P-type dopants, and at least one of niobium (Nb), vanadium (V), tantalum (Ta), tungsten (W), chrome (Cr), and molybdenum (Mo) may be used as the N-type dopants.

If the insulation layer 220 includes an aluminum oxide material or an aluminum nitride material, then at least one of titanium (Ti), copper (Cu), zirconium (Zr), hafnium (Hf), niobium (Nb), vanadium (V), tantalum (Ta), tungsten (W), chrome (Cr), and molybdenum (Mo) may be used as the N-type dopants.

As described above, according to an embodiment, the threshold switching operation region of the selection element 32 may be formed by doping the insulation layer 220 of each of the pillar-shaped structures 30 with dopants. In some embodiments, the threshold switching operation region may be smaller than the insulation layer 220. When the threshold switching operation region is smaller than the insulation layer 220, an off-current of the selection element 32 may be relatively reduced during the threshold switching operation. Accordingly, no additional etching process for reducing a size of the pillar-shaped structures 30 may be required to reduce the off-current of the selection element 32 when the threshold switching operation region is formed to be smaller than the insulation layer 220. Thus, any degradation of the reliability of the ReRAM device due to an etching or patterning process for changing a shape of the pillar-shaped structures 30 may be prevented.

FIGS. 2 to 5 are cross-sectional views illustrating various switching elements 32A, 32B, 32C, and 32D according to some embodiments. Any one of the switching elements 32A, 32B, 32C, and 32D illustrated in FIGS. 2 to 5 may be used as the selection element 32 of the cross-point array device 1 described with reference to FIGS. 1A and 1B.

Figure 2:
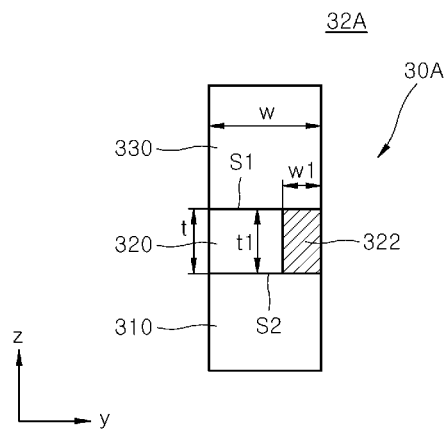
FIGS. 2 to 5 are cross-sectional views illustrating various switching elements according to some embodiments.

Referring to FIG. 2, the switching element 32A may include a pillar-shaped structure 30A, which includes a first electrode 310, an insulation layer pattern 320, and a second electrode 330. The switching element 32A may include a threshold switching operation region 322 disposed in the insulation layer pattern 320.

The threshold switching operation region 322 may extend from a sidewall of the insulation layer pattern 320 to an inside region of the insulation layer pattern 320. The threshold switching operation region 322 may be a portion of the insulation layer pattern 320 that contains dopants. For example, the threshold switching region 322 may be an N-type region or a P-type region by the dopants. For another example, the dopants may not show an N-typed or a P-typed electrical property in the threshold switching operation region 322. The dopants may form trap sites that are capable of capturing or moving conductive carriers moving through the threshold switching operation region 322.

The threshold switching operation region 322 may have a width w1 that is smaller than a width w of the insulation layer pattern 320 in a width direction (e.g., a Y-axis direction) of the pillar-shaped structure 30A. Although not shown in the drawings, in some embodiments, the width w1 of the threshold switching operation region 322 may be non-uniform, such that it varies along a Z-axis direction. In addition, the threshold switching operation region 322 may have a thickness t1 that is substantially equal to a thickness t of the insulation layer pattern 320 in the Z-axis direction. That is, the threshold switching operation region 322 may be disposed at an interface S1 between the insulation layer pattern 320 and the second electrode 330, and may extend to an interface S2 between the insulation layer pattern 320 and the first electrode 310.

If an external voltage is applied to the switching element 32A, the threshold switching operation of the switching element 32A may be performed in the threshold switching operation region 322. Movement of conductive carriers may be suppressed in regions of the insulation layer pattern 320 outside the threshold switching operation region 322, even when the external voltage is applied to the switching element 32A.

As described above, the threshold switching operation region 322 of the switching element 32A may be confined to a portion of the insulation layer pattern 320. Thus, if the switching element 32A is used as a selection element of a cross-point array device, an off-current of the selection element may be effectively reduced when the selection element is turned off, because the threshold switching operation region 322 is confined to a smaller region than the entire insulation layer pattern 320.

Figure 3:
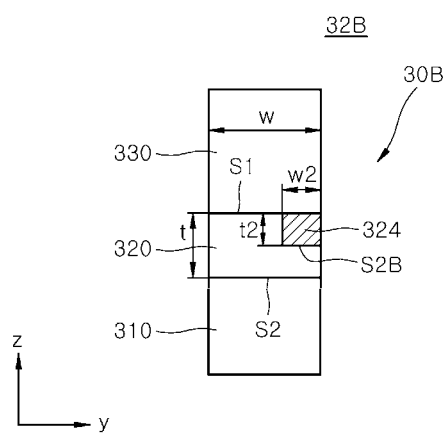

Referring to FIG. 3, the switching element 32B may include a threshold switching operation region 324, and the threshold switching operation region 324 may have a width w2 that is smaller than the width w of the insulation layer pattern 320 in a width direction (e.g., the Y-axis direction) of a pillar-shaped structure 30B. Although not shown in the drawings, in some embodiments, the width w2 of the threshold switching operation region 324 may be non-uniform, such that it varies along the Z-axis direction.

The threshold switching operation region 324 may have a thickness t2 that is smaller than the thickness t of the insulation layer pattern 320 in the Z-axis direction. The threshold switching operation region 324 may be disposed at the interface S1 between the insulation layer pattern 320 and the second electrode 330, and may extend to an interface S2B in a bulk region of the insulation layer pattern 320.

If an external voltage is applied to the switching element 32B, the threshold switching operation of the switching element 32B may be performed in the threshold switching operation region 324 as well as in a portion of the insulation layer pattern 320 located between the threshold switching operation region 324 and the first electrode 310. Specifically, when the switching element 32B is turned on, conductive carriers may reach the interface S2B after moving from the second electrode 330 through the threshold switching operation region 324. The conductive carriers may subsequently move toward the first electrode 310 through the portion of the insulation layer pattern 320 located between the threshold switching operation region 324 and the first electrode 310. The conductive carriers may move through the portion of the insulation layer pattern 320 by tunneling under the external voltage.

When the switching element 32B is turned off, an off-current of the switching element 32B may be effectively reduced because of the presence of the portion of the insulation layer pattern 320 located between the threshold switching operation region 324 and the first electrode 310.

Figure 4:
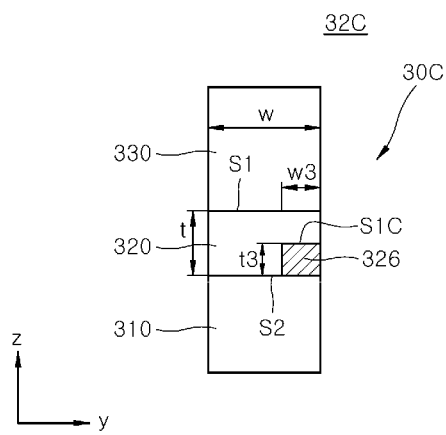

Referring to FIG. 4, the switching element 32C may include a threshold switching operation region 326, and the threshold switching operation region 326 may have a width w3 that is smaller than the width w of the insulation layer pattern 320 in a width direction (e.g., the Y-axis direction) of a pillar-shaped structure 30C. Although not shown in the drawings, in some embodiments, the width w3 of the threshold switching operation region 326 may be non-uniform, such that it varies along the Z-axis direction.

The threshold switching operation region 326 may have a thickness t3 that is smaller than the thickness t of the insulation layer pattern 320 in the Z-axis direction. The threshold switching operation region 326 may be disposed at the interface S2 between the insulation layer pattern 320 and the first electrode 310, and may extend to an interface S1C in a bulk region of the insulation layer pattern 320.

If an external voltage is applied to the switching element 32C, the threshold switching operation of the switching element 32C may be performed in the threshold switching operation region 326 as well as in a portion of the insulation layer pattern 320 located between the threshold switching operation region 326 and the second electrode 330. Specifically, when the switching element 32C is turned on, conductive carriers from the first electrode 310 may reach the interface S1C by moving through the threshold switching operation region 326. The conductive carriers may subsequently move towards the second electrode 330 through the portion of the insulation layer pattern 320 located between the threshold switching operation region 326 and the second electrode 330. The conductive carriers may move through the portion of the insulation layer pattern 320 by tunneling under the external voltage.

When the switching element 32C is turned off, an off-current of the switching element 32C may be effectively reduced because of the presence of the portion of the insulation layer pattern 320 located between the threshold switching operation region 326 and the second electrode 330.

Figure 5:
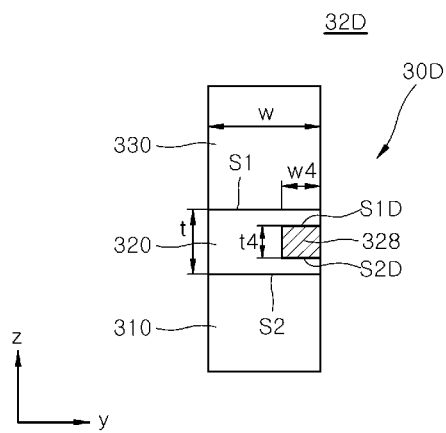

Referring to FIG. 5, the switching element 32D may include a threshold switching operation region 328, and the threshold switching operation region 328 may have a width w4 that is smaller than the width w of the insulation layer pattern 320 in a width direction (e.g., the Y-axis direction) of a pillar-shaped structure 30D. Although not shown in the drawings, in some embodiments, the width w4 of the threshold switching operation region 328 may be non-uniform, such that it varies along the Z-axis direction.

The threshold switching operation region 328 may have a thickness t4 that is smaller than the thickness t of the insulation layer pattern 320 in the Z-axis direction. The threshold switching operation region 328 may be disposed between one interface S1D in a bulk region of the insulation layer pattern 320 and another interface S2D in the bulk region of the insulation layer pattern 320, which is lower than the interface S1D in the Z-axis direction.

If an external voltage is applied to the switching element 32D, the threshold switching operation of the switching element 32D may be performed in the threshold switching operation region 328 as well as in portions of the insulation layer pattern 320 located between the threshold switching operation region 328 and the first and second electrodes 310 and 330, respectively.

The portions of the insulation layer pattern 320 located between the threshold switching operation region 328 and the first and second electrodes 310 and 330, respectively, may reduce an off-current of the switching element 32D when the switching element 32D is turned off and may be tunneled by conductive carriers when the switching element 32D is turned on.

In the above embodiments described with reference to FIGS. 2 to 5, each of the threshold switching operation regions 322, 324, 326, and 328 of the switching elements 32A, 32B, 32C, and 32D extends from one sidewall of the insulation layer pattern 320 to an inside region of the insulation layer pattern 320. However, embodiments are not limited thereto. For example, in some embodiments, each of the threshold switching operation regions 322, 324, 326, and 328 may extend from two sidewalls of the insulation layer pattern 320 to an inside region of the insulation layer pattern 320.

A size (or a width) of each of the threshold switching operation regions 322, 324, 326, and 328 may be controlled by a distribution of dopants injected into the insulation layer pattern 320. In the embodiments, the dopants may make each of the threshold switching operation regions 322, 324, 326, and 328 into a P-type region or an N-type region. In the embodiments illustrated in FIGS. 2 to 5, each of the threshold switching operation regions 322, 324, 326, and 328 of the switching elements 32A, 32B, 32C, and 32D is illustrated to be smaller than the insulation layer pattern 320. However, embodiments are not limited thereto. For example, in some embodiments, a size (or a width) of each of the threshold switching operation regions 322, 324, 326, and 328 may be substantially equal to a size (or a width) of the insulation layer pattern 320.

Hereinafter, a method of forming a threshold switching operation region of a switching element in a pillar-shaped structure according to an embodiment will be described.

Figure 6:
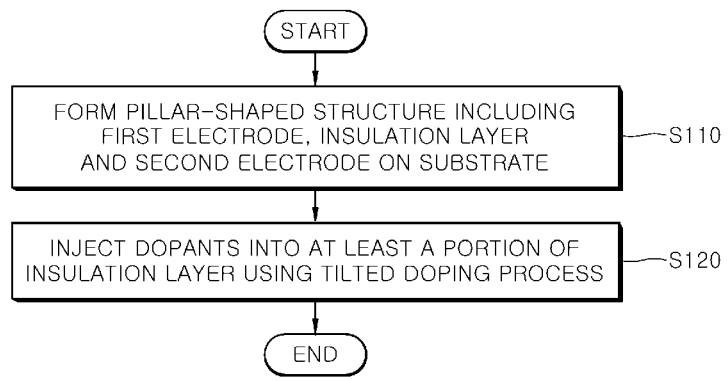
FIG. 6 is a flowchart illustrating a method of manufacturing a switching element according to an embodiment.

FIG. 6 is a flowchart illustrating a method of manufacturing a switching element according to an embodiment. The method illustrated in FIG. 6 may be applied to a method of manufacturing the selection elements 32 of the cross-point array device 1 described with reference to FIGS. 1A and 1B.

Referring to FIG. 6, pillar-shaped structures including first electrodes, insulation layers, and second electrodes may be formed on a substrate at S110. In some embodiments, a process for forming the pillar-shaped structures may be performed as follows. First, a first electrode material layer, an insulation material layer, and a second electrode material layer may be sequentially formed on the substrate. Subsequently, the second electrode material layer, the insulation material layer, and the first electrode material layer may be patterned to form the pillar-shaped structures located at cross points of a plurality of rows and a plurality of columns.

The insulation material layer may include at least one selected from the group consisting of a silicon oxide layer, a silicon nitride layer, a metal oxide layer, and a metal nitride layer.

A tilted doping process may be applied to the pillar-shaped structures to inject N-type dopants or P-type dopants into at least a portion of each of the patterned insulation material layers at S120. The patterned insulation material layers may correspond to the insulation layers. The tilted doping process may generate a threshold switching operation region in each switching element by forming trap sites of conductive carriers in each of the insulation layers. In such a case, a size of the threshold switching operation region of each switching element may be controlled by the distribution of the dopants in the respective insulation layer.

In some embodiments, the tilted doping process may be performed using a tilted ion implantation process, in which the dopants are injected into a sidewall of each of the pillar-shaped structures.

Specifically, the tilted doping process may be performed so that the dopants are distributed in a region of the insulation layer that extends from an interface between the insulation layer and the first electrode to an interface between the insulation layer and the second electrode in each switching element. As a result, a threshold switching operation region having substantially the same configuration as the threshold switching operation region 322 of the switching element 32A illustrated in FIG. 2 may be formed. In other embodiments, the tilted doping process may be performed so that the dopants are distributed in a lower portion, a mid-level portion, or an upper portion of the insulation layer of each switching element. In such a case, a threshold switching operation region, having substantially the same configuration as any one of the threshold switching operation regions 324, 326, and 328 of the switching elements 32B, 32C, and 32D illustrated in FIGS. 3, 4, and 5, may be formed.

The switching elements may be formed by performing one or more of the above processes. In the method of forming the switching elements according to the embodiment illustrated by FIG. 6, the pillar-shaped structures, each of which includes an insulation layer, may be formed at S110 by a patterning process such as an etch process. Subsequently, the threshold switching operation region may be formed in at least a portion of the insulation layer of each pillar-shaped structure using the tilted doping process at S120. Accordingly, when the switching element including the pillar-shaped structure is manufactured, a size of the threshold switching operation region may be readily controlled even without additional modification of a shape of the pillar-shaped structure.

Various methods of manufacturing switching elements, and a ReRAM device employing the switching elements as selection elements, will be described hereinafter.

FIGS. 7A, 8A, 9A, 10A, and 11A are plan views illustrating a method of manufacturing a ReRAM device according to a first embodiment. FIGS. 7B, 8B, 9B, 10B, and 11B are cross-sectional views taken along a line I-I' of FIGS. 7A, 8A, 9A, 10A, and 11A, respectively. FIGS. 7C, 8C, 9C, 10C, and 11C are cross-sectional views taken along a line II-II' of FIGS. 7A, 8A, 9A, 10A, and 11A, respectively.

Figure 7A:
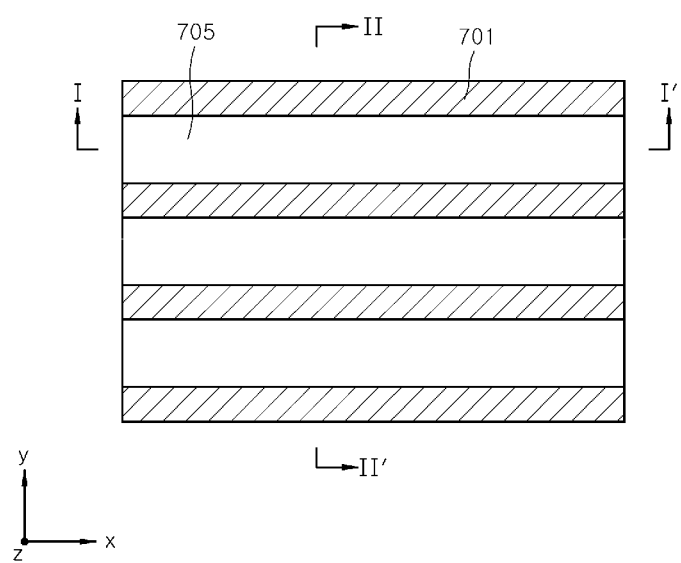
FIGS. 7A, 8A, 9A, 10A, and 11A are plan views illustrating a method of manufacturing a resistive random access memory (ReRAM) device according to a first embodiment.
Figure 7B:
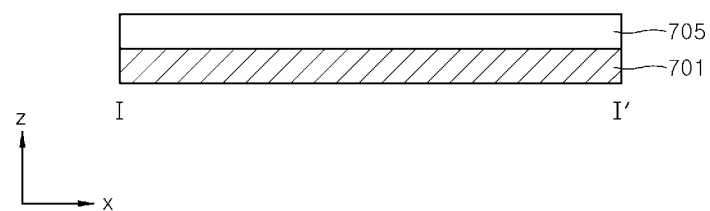
FIGS. 7B, 8B, 9B, 10B, and 11B are cross-sectional views taken along a line I-I' of FIGS. 7A, 8A, 9A, 10A, and 11A, respectively.
Figure 7C:
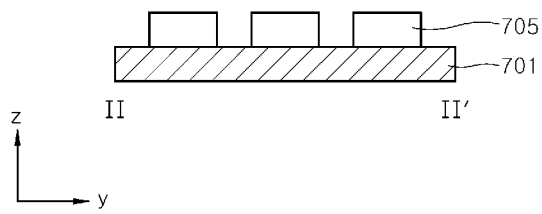
FIGS. 7C, 8C, 9C, 10C, and 11C are cross-sectional views taken along a line II-II' of FIGS. 7A, 8A, 9A, 10A, and 11A, respectively.

Referring to FIGS. 7A, 7B, and 7C, lower conductive lines 705 may be formed on a substrate 701. In some embodiments, a process for forming the lower conductive lines 705 may include forming a conductive layer on the substrate 701 using a deposition process, and then patterning the conductive layer using a lithography process and an etch process.

The substrate 701 may be a silicon substrate or a gallium arsenide substrate. However, embodiments are not limited thereto. For example, in some embodiments, the substrate 701 may be a ceramic substrate, a polymer substrate, or a metallic substrate, which can be processed by a semiconductor process. The substrate 701 may include an integrated circuit. The lower conductive lines 705 may include a metal material, a conductive metal nitride material, or a conductive metal oxide material.

Figure 8A:
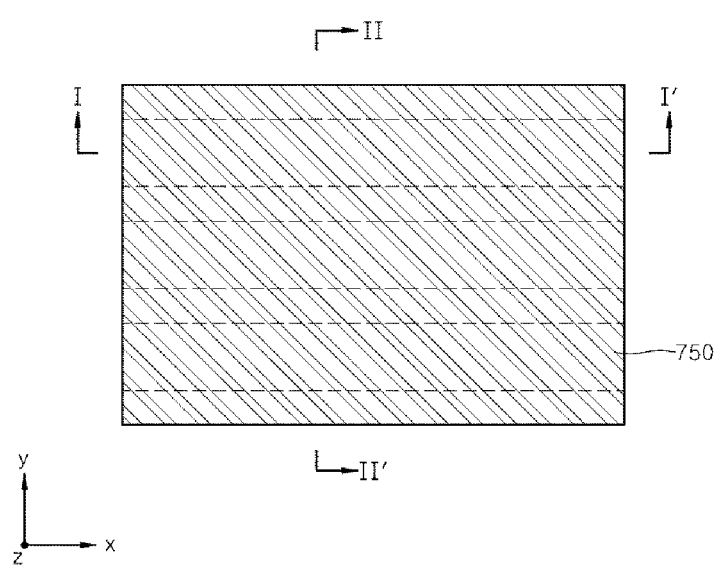
Figure 8B:
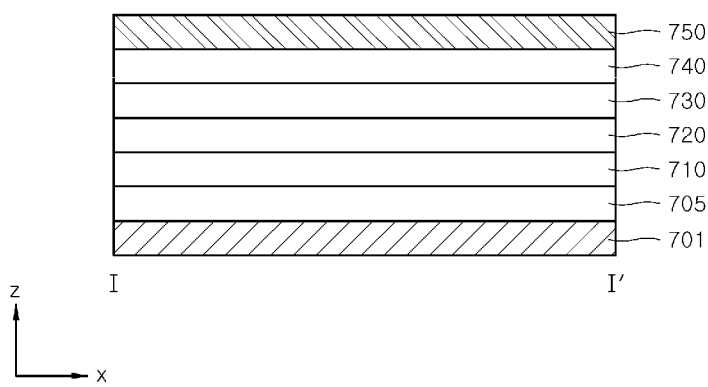
Figure 8C:
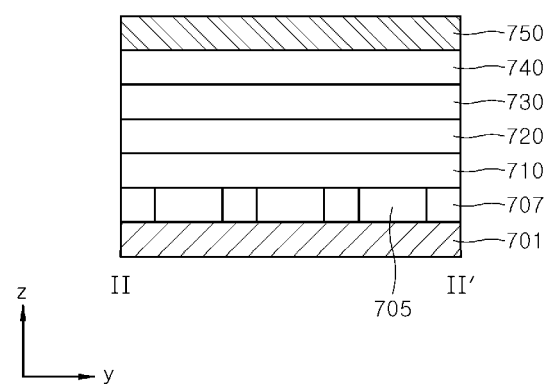

Referring to FIGS. 8A, 8B, and 8C, a lower insulation layer 707 may be formed to fill spaces between the lower conductive lines 705. Subsequently, a lower electrode layer 710, a resistive memory layer 720, a middle electrode layer 730, an insulation layer 740, and an upper electrode layer 750 may be sequentially stacked on the lower conductive lines 705 and the lower insulation layer 707.

The lower electrode layer 710, the middle electrode layer 730, and the upper electrode layer 750 may each include a metal material, a conductive metal nitride material, or a conductive metal oxide material. For example, the lower electrode layer 710, the middle electrode layer 730, and the upper electrode layer 750 may each include gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), or ruthenium oxide ($RuO_2$). The lower electrode layer 710, the middle electrode layer 730, and the upper electrode layer 750 may each be formed using a sputtering process, an atomic layer deposition (ALD) process, an evaporation process, a chemical vapor deposition (CVD) process, or an electron beam deposition process.

In some embodiments, the resistive memory layer 720 may include a metal oxide material such as a titanium oxide material, an aluminum oxide material, a nickel oxide material, a copper oxide material, a zirconium oxide material, a manganese oxide material, a hafnium oxide material, a tungsten oxide material, a tantalum oxide material, a niobium oxide material, or an iron oxide material. In other embodiments, the resistive memory layer 720 may include a perovskite material such as a praseodymium calcium manganese oxide ($Pr_{0.7}Ca_{0.3}MnO_3$) material, a $La_{1-x}Ca_x$-$MnO_3$ (LCMO) material, a $Ba_{0.5}Sr_{0.5}Co_{0.8}Fe_{0.2}O_{3-\delta}$ (BSCFO) material, a $YBa_2Cu_3O_{7-x}$ (YBCO) material, a $(Ba,Sr)TiO_3(Cr,Nb\text{-doped})$ material, a $SrZrO_3(Cr,V\text{-doped})$ material, a $(La,Sr)MnO_3$ material, a $Sr_{1-x}La_xTiO_3$ material, a $La_{1-x}Sr_xFeO_3$ material, a $La_{1-x}Sr_xCoO_3$ material, a $SrFeO_{2.7}$ material, a $LaCoO_3$ material, a $RuSr_2GdCu_2O_3$ material, or a $YBa_2Cu_3O_7$ material. In yet other embodiments, the resistive memory layer 720 may include a metal sulfide material, for example, an $Ag_2S$ material, a $Cu_2S$ material, a CdS material, or a ZnS material. In still other embodiments, the resistive memory layer 720 may include a selenide material such as $Ge_xSe_{1-x}(Ag,Cu,Te\text{-doped})$. The resistive memory layer 720 may be formed using a sputtering process, an atomic layer deposition (ALD) process, an evaporation process, a chemical vapor deposition (CVD) process, or an electron beam deposition process.

The insulation layer 740 may include a silicon oxide material, a silicon nitride material, a metal oxide material, a metal nitride material, or a combination containing at least two materials thereof. For example, the insulation layer 740 may include an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, or an iron oxide material.

The insulation layer 740 may be formed using a sputtering process, an atomic layer deposition (ALD) process, an evaporation process, a chemical vapor deposition (CVD) process, or an electron beam deposition process. The above-listed compound materials in the insulation layer 740 may have a nonstoichiometric composition. The insulation layer 740 may have an amorphous structure.

Figure 9A:
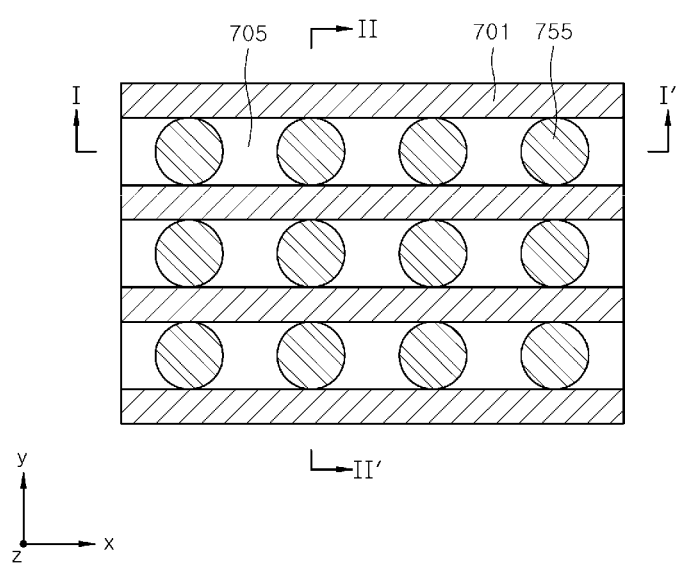
Figure 9B:
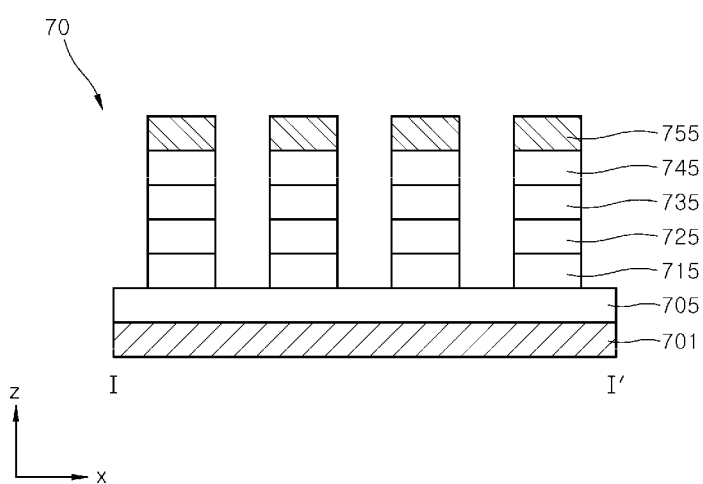
Figure 9C:
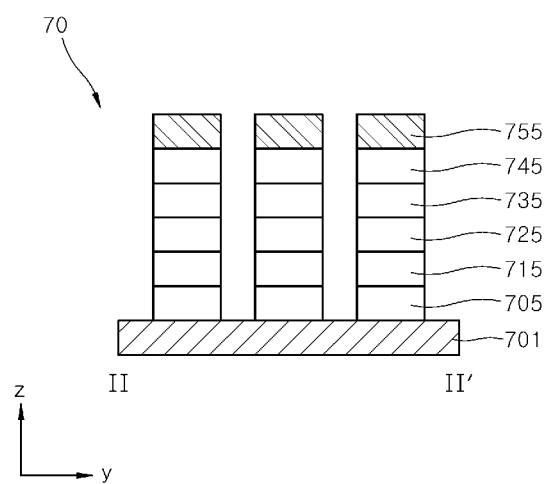

Referring to FIGS. 9A, 9B, and 9C, an array of pillar-shaped structures 70 may be formed on the lower conductive lines 705. Each of the pillar-shaped structures 70 may include a lower electrode 715, a resistive memory layer pattern 725, a middle electrode 735, an insulation layer pattern 745, and an upper electrode 755, which are respectively formed by patterning the lower electrode layer 710, the resistive memory layer 720, the middle electrode layer 730, the insulation layer 740, and the upper electrode layer 750.

Figure 10A:
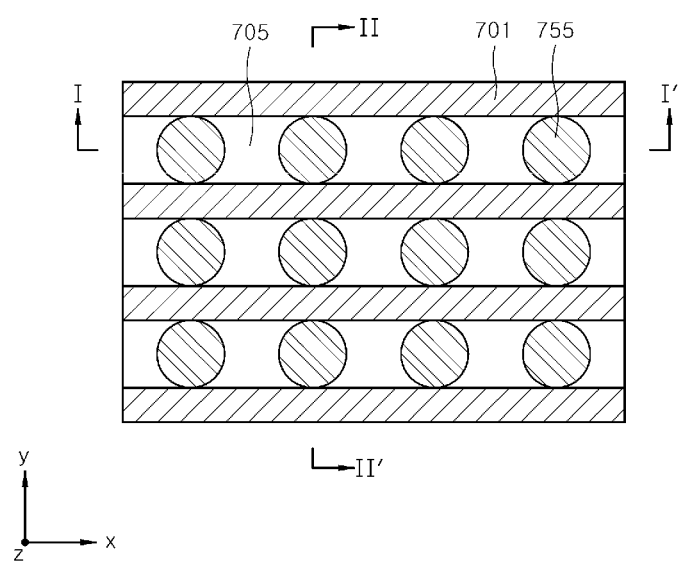
Figure 10B:
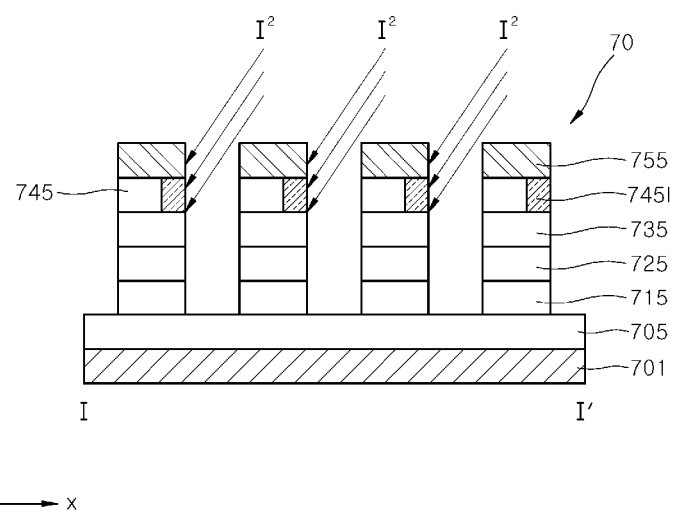
Figure 10C:
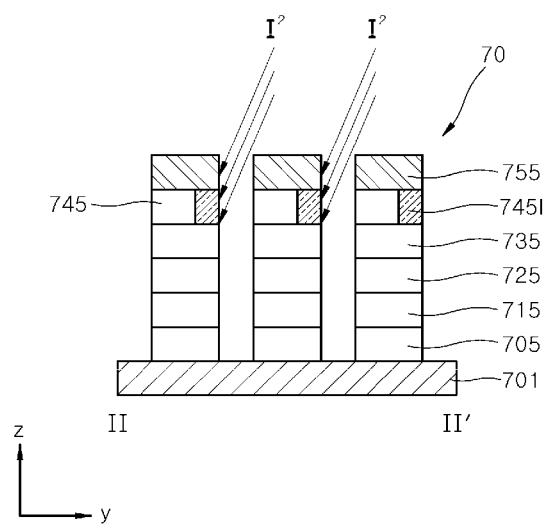

Referring to FIGS. 10A, 10B, and 10C, a tilted doping process may be applied to the pillar-shaped structures 70, in which dopants are injected into at least a portion of each of the insulation layer patterns 745. The dopants may be N-type dopants or P-type dopants.

In some embodiments, if the insulation layer patterns 745 include a silicon oxide material or a silicon nitride material, the dopants may include at least one selected from aluminum (Al), lanthanum (La), niobium (Nb), vanadium (V), tantalum (Ta), tungsten (W), chrome (Cr), and molybdenum (Mo). Specifically, if the insulation layer patterns 745 include a silicon oxide material, then aluminum (Al) or lanthanum (La) may be used as the P-type dopants, and at least one of niobium (Nb), vanadium (V), tantalum (Ta), tungsten (W), chrome (Cr), and molybdenum (Mo) may be used as the N-type dopants. In other embodiments, if the insulation layer patterns 745 include an aluminum oxide material or an aluminum nitride material, then at least one of titanium (Ti), copper (Cu), zirconium (Zr), hafnium (Hf), niobium (Nb), vanadium (V), tantalum (Ta), tungsten (W), chrome (Cr), and molybdenum (Mo) may be used as the N-type dopants in the insulation layer patterns 745.

In some embodiments, the tilted doping process may be performed using a tilted ion implantation process, in which dopants $I^2$ are injected into a sidewall of each of the pillar-shaped structures 70. In such a case, the dopants $I^2$ may be applied only to regions or patterns of the pillar-shaped structures 70 that are disposed above the resistive memory layer patterns 725 by controlling at least one factor selected from the group consisting of an implantation angle, an ion dose, and an implantation energy of the tilted ion implantation process. Thus, the tilted ion implantation process may not damage the resistive memory layer patterns 725, nor change electrical properties of the resistive memory layer patterns 725.

As a result of the tilted doping process, a threshold switching operation region 7451 may be formed in each of the insulation layer patterns 745. A size of each of the threshold switching operation regions 7451 may be controlled by controlling a size of a distribution region containing the dopants injected into each of the insulation layer patterns 745 during the tilted doping process. For example, each of the threshold switching operation regions 7451 may have substantially the same shape and structure as any one of the threshold switching operation regions 322, 324, 326, and 328 of the switching elements 32A, 32B, 32C, and 32D described with reference to FIGS. 2 to 5.

Figure 11A:
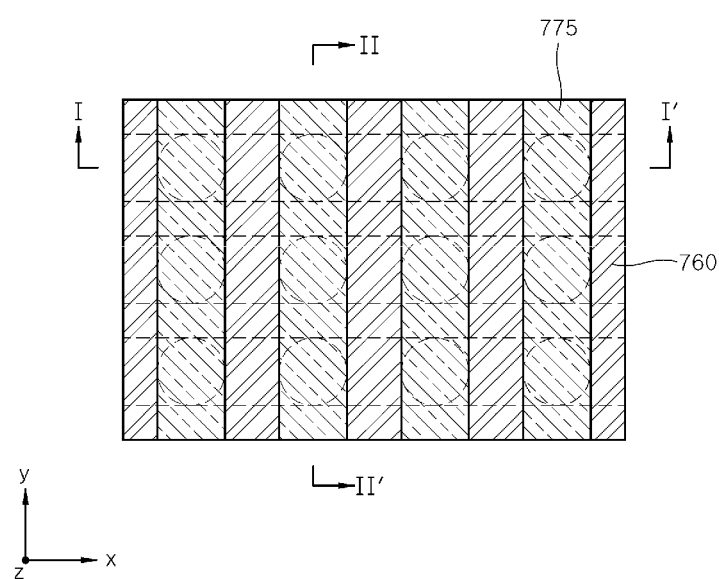
Figure 11B:
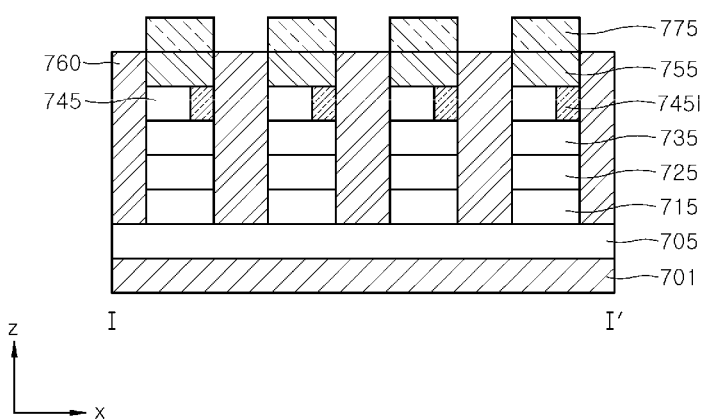
Figure 11C:
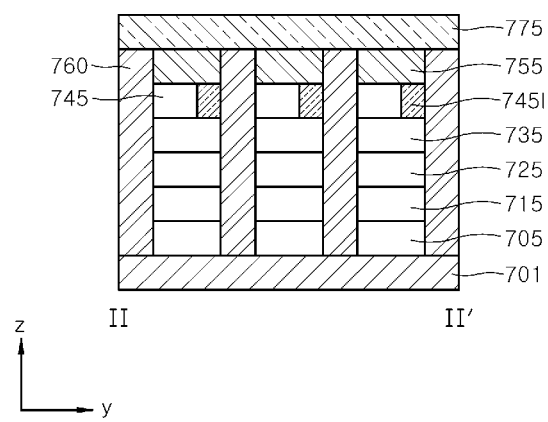

Referring to FIGS. 11A, 11B, and 11C, a first interlayer insulation layer 760 may be formed to fill spaces between the pillar-shaped structures 70. Subsequently, a plurality of upper conductive lines 775 may be formed on the upper electrodes 755 and the first interlayer insulation layer 760. The upper conductive lines 775 may be nonparallel with the lower conductive lines 705.

In some embodiments, a process for forming the upper conductive lines 775 may include forming a conductive layer on the upper electrodes 755 and the first interlayer insulation layer 760 using a deposition process, and then patterning the conductive layer using a lithography process and an etch process. The upper conductive lines 775 may include a metal material, a conductive metal nitride material, or a conductive metal oxide material.

A ReRAM device may be fabricated by the above processes according to the first embodiment. The ReRAM device may include the lower conductive lines 705 and the upper conductive lines 775, which are nonparallel with the lower conductive lines 705. In addition, the ReRAM device may include the pillar-shaped structures 70 respectively located at cross points of the lower conductive lines 705 and the upper conductive lines 775, and each of the pillar-shaped structures 70 may include a variable resistive element and a selection element, which are stacked. The variable resistive element may include the lower electrode 715, the resistive memory layer pattern 725, and the middle electrode 735. The selection element may include the middle electrode 735, the insulation layer pattern 745 in which the threshold switching operation region 7451 is formed, and the upper electrode 755.

FIGS. 12A, 13A, 14A, and 15A are plan views illustrating a method of manufacturing a resistive random access memory (ReRAM) device according to a second embodiment. FIGS. 12B, 13B, 14B, and 15B are cross-sectional views taken along a line I-I' of FIGS. 12A, 13A, 14A, and 15A, respectively. FIGS. 12C, 13C, 14C, and 15C are cross-sectional views taken along a line II-II' of FIGS. 12A, 13A, 14A, and 15A, respectively.

Figure 12A:
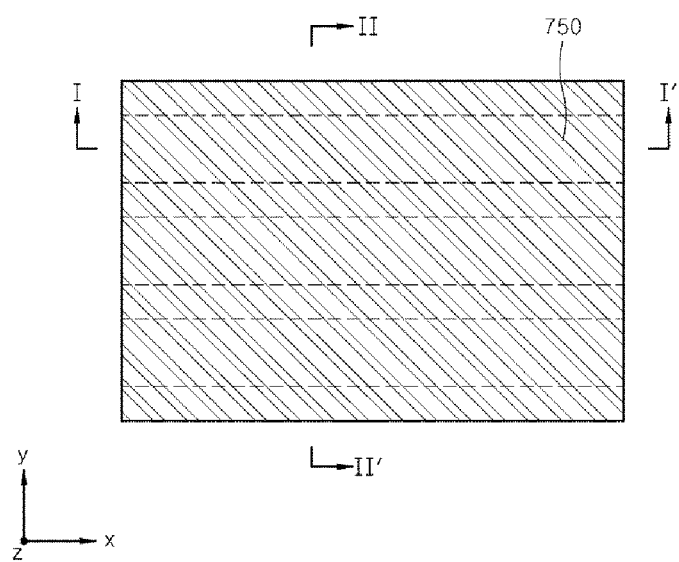
FIGS. 12A, 13A, 14A, and 15A are plan views illustrating a method of manufacturing a resistive random access memory (ReRAM) device according to a second embodiment.
Figure 12B:
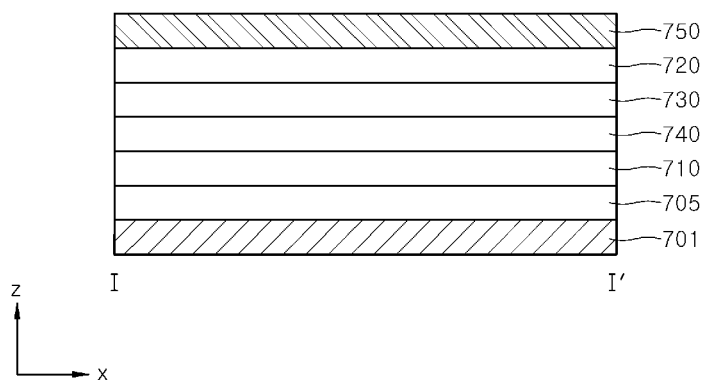
FIGS. 12B, 13B, 14B, and 15B are cross-sectional views taken along a line I-I' of FIGS. 12A, 13A, 14A, and 15A, respectively.
Figure 12C:
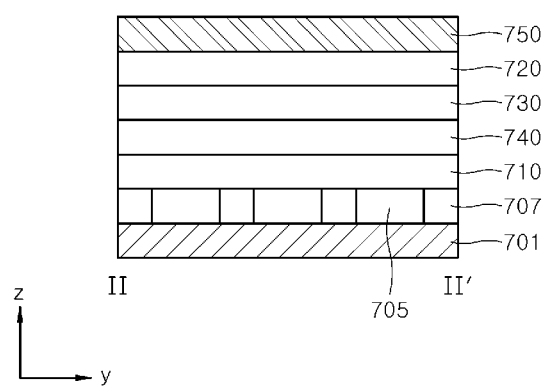
FIGS. 12C, 13C, 14C, and 15C are cross-sectional views taken along a line II-II' of FIGS. 12A, 13A, 14A, and 15A, respectively.

Referring to FIGS. 12A, 12B, and 12C, the lower conductive lines 705 may be formed on the substrate 701. The lower conductive lines 705 may be formed using substantially the same method as described above with reference to FIGS. 7A, 7B, and 7C. Subsequently, the lower insulation layer 707 may be formed to fill spaces between the lower conductive lines 705. The lower electrode layer 710, the insulation layer 740, the middle electrode layer 730, the resistive memory layer 720, and the upper electrode layer 750 may then be sequentially stacked on the lower conductive lines 705 and the lower insulation layer 707.

In the present embodiment, the lower electrode layer 710, the insulation layer 740, the middle electrode layer 730, the resistive memory layer 720, and the upper electrode layer 750 may be stacked in a different sequence from the order described above with reference to FIGS. 8A, 8B, and 8C of the first embodiment.

Figure 13A:
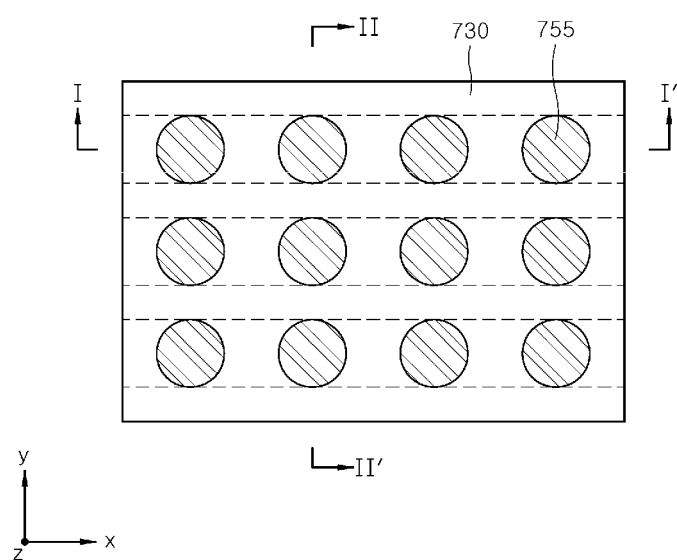
Figure 13B:
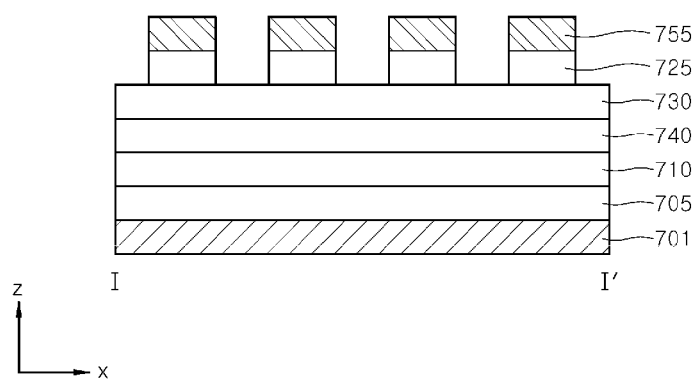
Figure 13C:
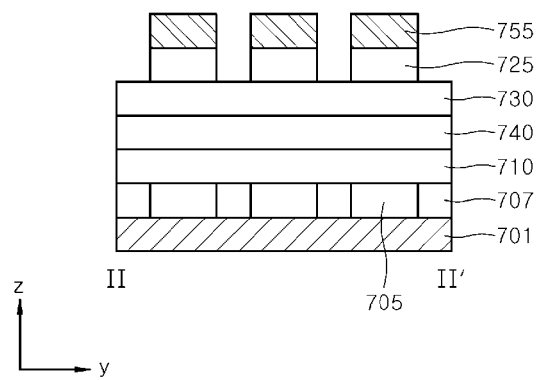

Referring to FIGS. 13A, 13B, and 13C, the upper electrode layer 750 and the resistive memory layer 720 may be patterned to form a plurality of upper pillar-shaped structures on the middle electrode layer 730. Each of the upper pillar-shaped structures may include the resistive memory layer pattern 725 and the upper electrode 755, which are sequentially stacked.

Figure 14A:
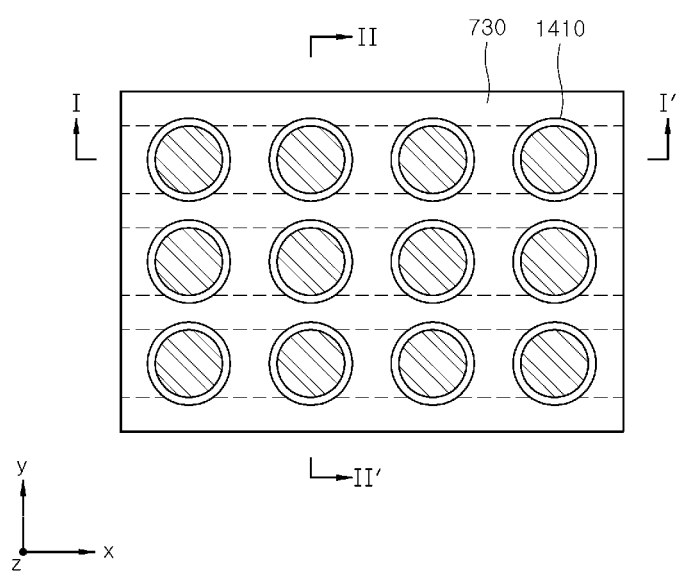
Figure 14B:
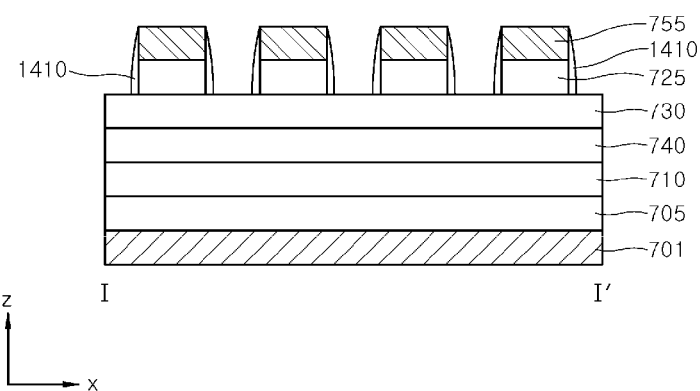
Figure 14C:
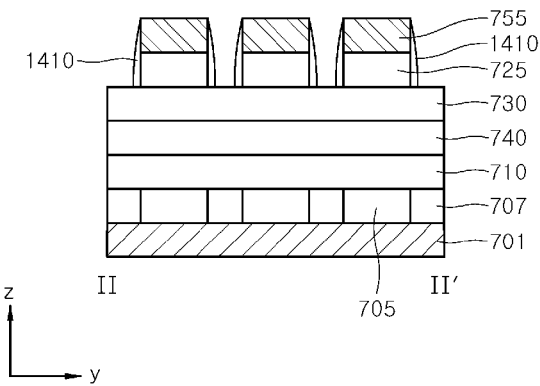

Referring to FIGS. 14A, 14B, and 14C, spacers 1410 may be formed on sidewalls of the upper pillar-shaped structures that include the resistive memory layer patterns 725 and the upper electrodes 755. The spacers 1410 may cover sidewalls of the resistive memory layer patterns 725. In an embodiment, the spacers 1410 may also cover the upper electrodes 755.

The spacers 1410 may be formed of a material having a different etch selectivity than the lower electrode layer 710, the insulation layer 740, and the middle electrode layer 730. The spacers 1410 may function as protection layers or doping suppression layers during an ion implantation process, which is performed in a subsequent step.

Figure 15A:
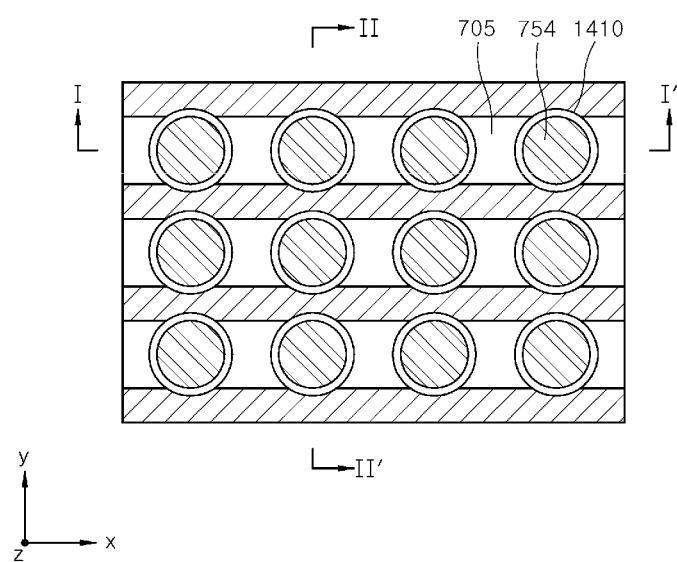
Figure 15B:
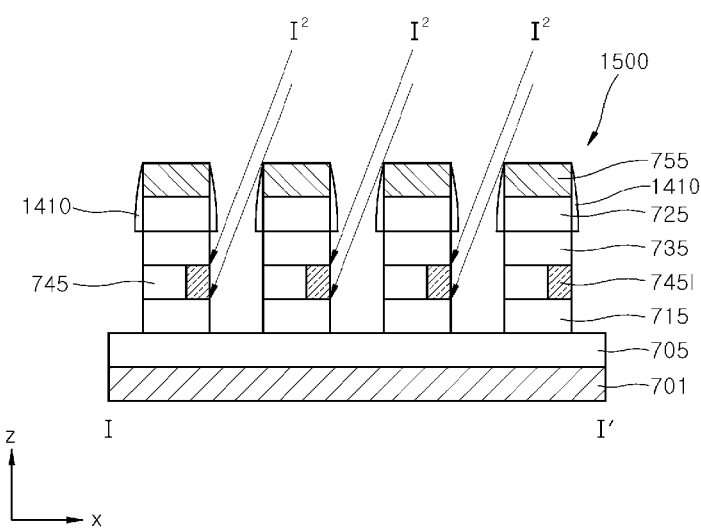
Figure 15C:
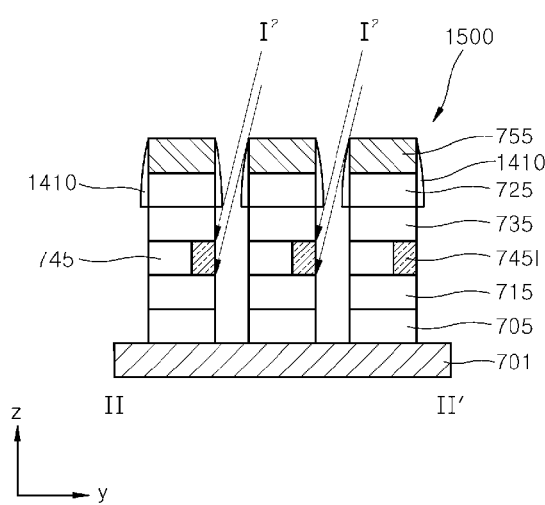

Referring to FIGS. 15A, 15B, and 15C, the middle electrode layer 730, the insulation layer 740, and the lower electrode layer 710 may be patterned to form a plurality of lower pillar-shaped structures. Each of the lower pillar-shaped structures may include the lower electrode 715, the insulation layer pattern 745, and the middle electrode 735, which are sequentially stacked. The lower pillar-shaped structure and the upper pillar-shaped structure, which are sequentially stacked, may constitute a pillar-shaped structure 1500.

Subsequently, a tilted doping process may be applied to the pillar-shaped structures 1500, such that dopants are injected into at least a portion of each of the insulation layer patterns 745. In some embodiments, the tilted doping process may be performed using a tilted ion implantation process, in which dopants $I^2$ are implanted into the insulation layer pattern 745 at an angle. In such a case, the spacers 1410 may function as protection layers for preventing the resistive memory layer patterns 725 from being physically damaged during the tilted ion implantation process. Moreover, the spacers 1410 may block the dopants $I^2$ from being injected into the resistive memory layer patterns 725 during the tilted ion implantation process. Thus, the spacers 1410 may prevent the tilted ion implantation process from changing an electrical property of the resistive memory layer patterns 725.

As a result of the tilted doping process, a threshold switching operation region 7451 may be formed in each of the insulation layer patterns 745. A size of each of the threshold switching operation regions 7451 may be controlled by controlling a size of a distribution region containing the dopants injected into each of the insulation layer patterns 745 during the tilted doping process.

Subsequently, although not shown in the drawings, the first interlayer insulation layer 760 and the plurality of upper conductive lines 775 may be formed using the same processes described with reference to FIGS. 11A, 11B, and 11C. As such, a ReRAM device may be fabricated by the above processes according to the second embodiment. The ReRAM device fabricated according to the second embodiment may have substantially the same configuration and structure as the ReRAM device fabricated by the first embodiment except that the ReRAM device fabricated according to the second embodiment may have different locations where the resistive memory layer patterns 725 and the insulation layer patterns 745 including the threshold switching operation regions 7451 are formed.

FIGS. 16A, 17A, 18A, 19A, 20A, 21A, and 22A are plan views illustrating a method of manufacturing a ReRAM device according to a third embodiment. FIGS. 16B, 17B, 18B, 19B, 20B, 21B, and 22B are cross-sectional views taken along a line I-I' of FIGS. 16A, 17A, 18A, 19A, 20A, 21A, and 22A, respectively. FIGS. 16C, 17C, 18C, 19C, 20C, 21C, and 22C are cross-sectional views taken along a line II-II' of FIGS. 16A, 17A, 18A, 19A, 20A, 21A, and 22A, respectively.

Figure 16A:
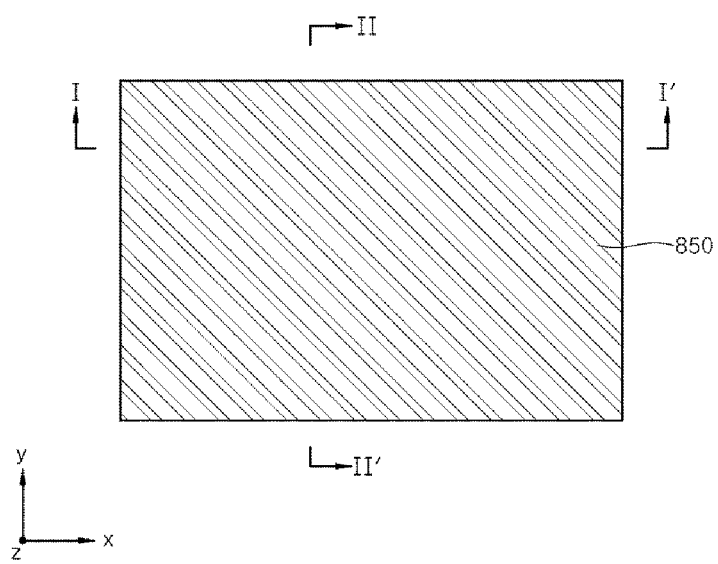
FIGS. 16A, 17A, 18A, 19A, 20A, 21A, and 22A are plan views illustrating a method of manufacturing a resistive random access memory (ReRAM) device according to a third embodiment.
Figure 16B:
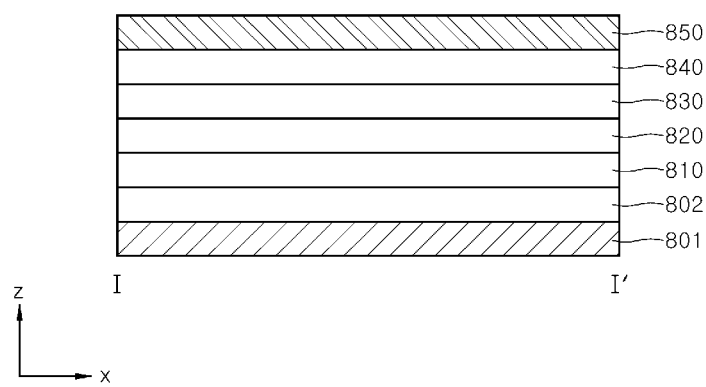
FIGS. 16B, 17B, 18B, 19B, 20B, 21B, and 22B are cross-sectional views taken along a line I-I' of FIGS. 16A, 17A, 18A, 19A, 20A, 21A, and 22A, respectively.
Figure 16C:
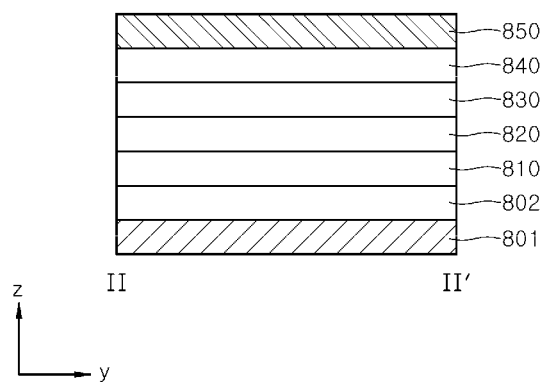
FIGS. 16C, 17C, 18C, 19C, 20C, 21C, and 22C are cross-sectional views taken along a line II-II' of FIGS. 16A, 17A, 18A, 19A, 20A, 21A, and 22A, respectively.

Referring to FIGS. 16A, 16B, and 16C, a lower conductive layer 802, a lower electrode layer 810, a resistive memory layer 820, a middle electrode layer 830, an insulation layer 840, and an upper electrode layer 850 may be sequentially stacked on a substrate 801.

The substrate 801 may be substantially the same as the substrate 701 described in the first and second embodiments. The lower conductive layer 802, the lower electrode layer 810, the resistive memory layer 820, the middle electrode layer 830, the insulation layer 840, and the upper electrode layer 850 may be formed of substantially the same materials as the lower conductive lines 705, the lower electrode layer 710, the resistive memory layer 720, the middle electrode layer 730, the insulation layer 740, and the upper electrode layer 750, respectively.

Figure 17A:
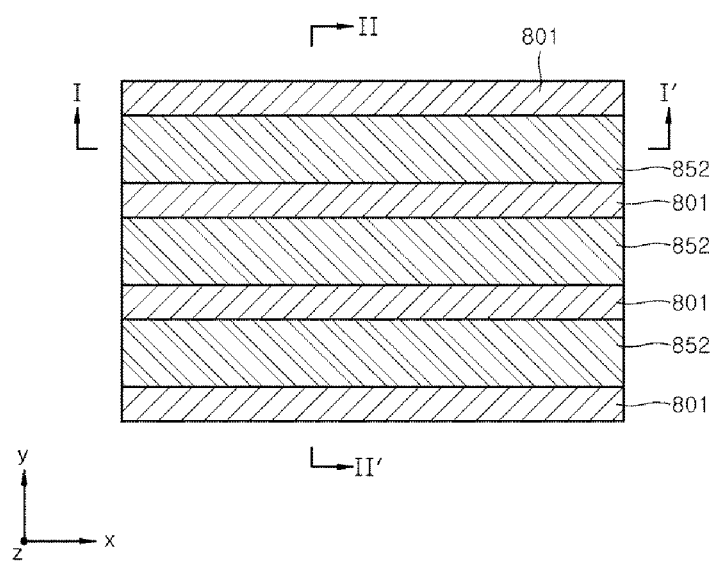
Figure 17B:
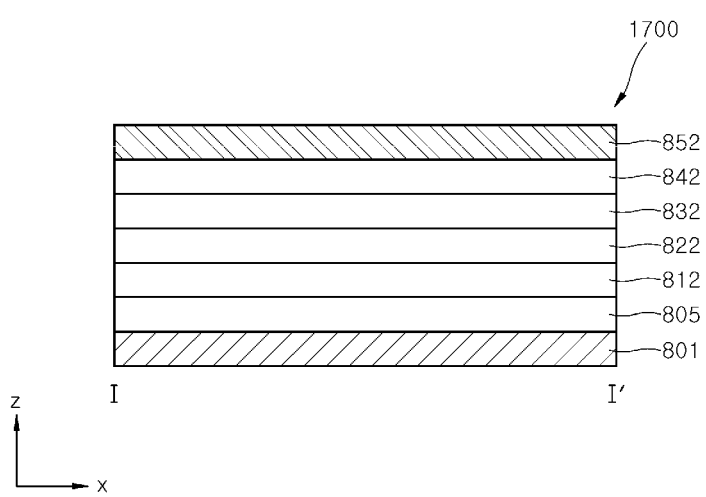
Figure 17C:
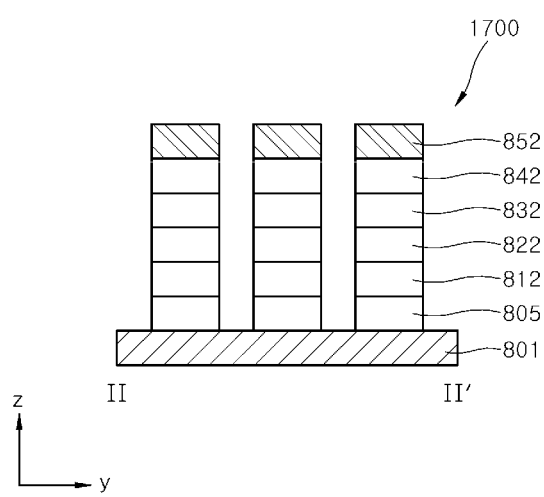

Referring to FIGS. 17A, 17B, and 17C, the upper electrode layer 850, the insulation layer 840, the middle electrode layer 830, the resistive memory layer 820, the lower electrode layer 810, and the lower conductive layer 802 may be patterned to form a plurality of first line-shaped stack structures 1700 that are parallel to an X-axis direction.

Each of the first line-shaped stack structures 1700 may include a lower conductive line 805, a lower electrode line 812, a resistive memory line 822, a middle electrode line 832, an insulation line 842, and an upper electrode line 852, which are sequentially stacked on the substrate 801.

Figure 18A:
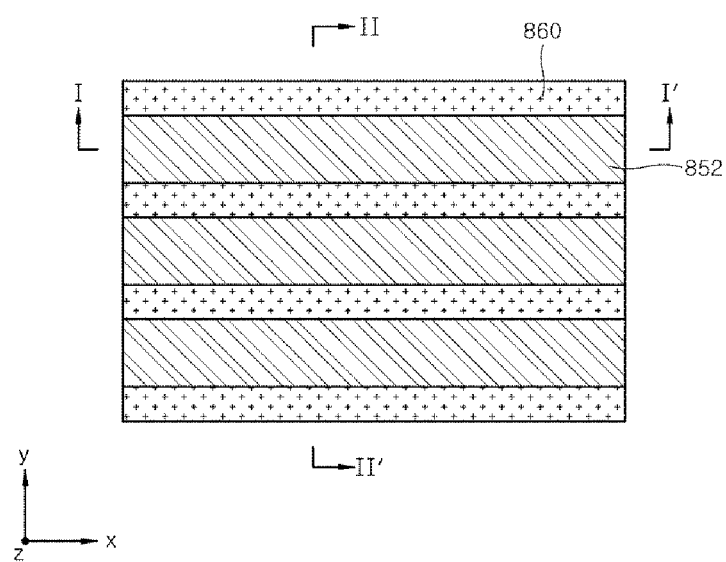
Figure 18B:
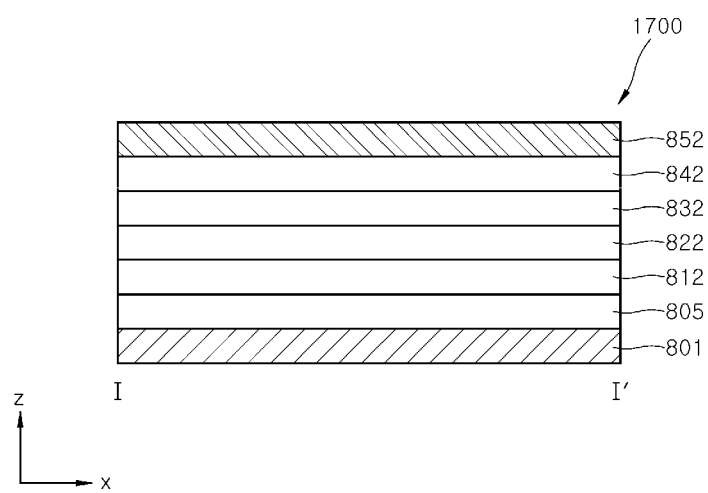
Figure 18C:
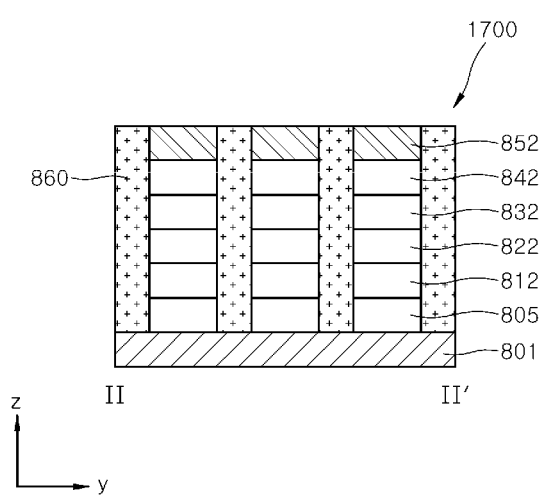

Referring to FIGS. 18A, 18B, and 18C, a first interlayer insulation layer 860 may be formed to fill spaces between the first line-shaped stack structures 1700.

Figure 19A:
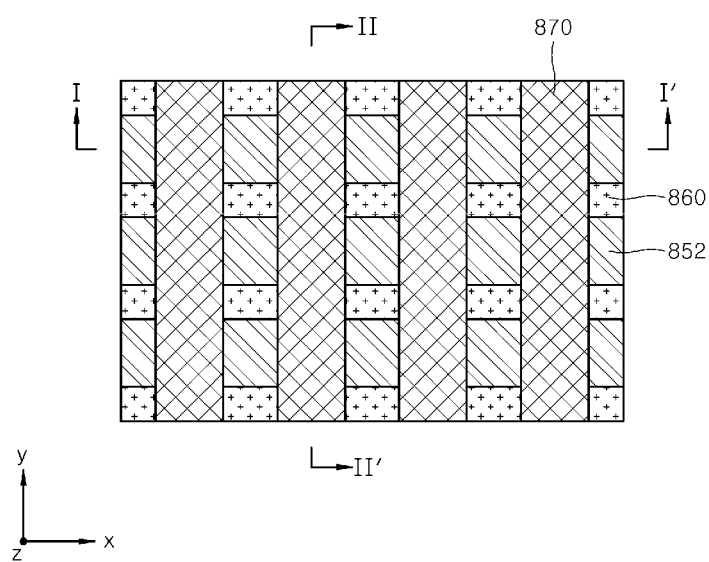
Figure 19B:
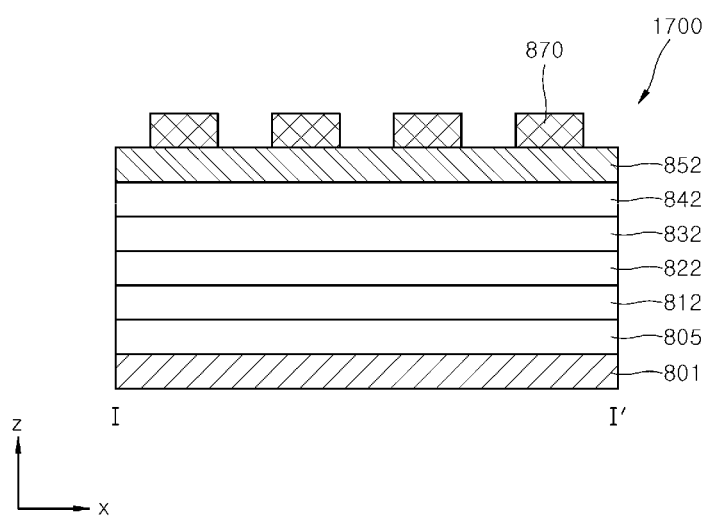
Figure 19C:
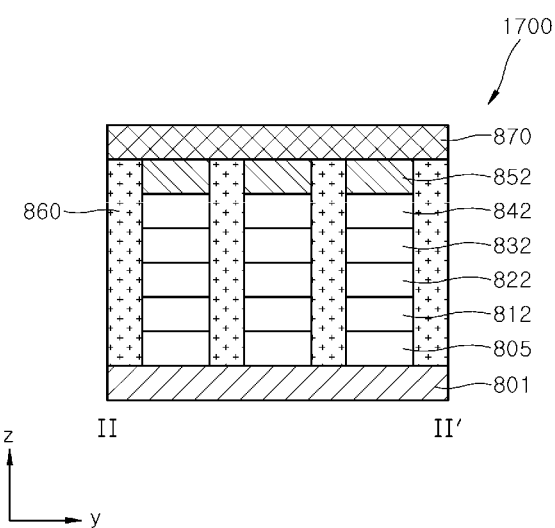

Referring to FIGS. 19A, 19B, and 19C, line-shaped mask patterns 870 may be formed on the first interlayer insulation layer 860 and the upper electrode lines 852, and may be parallel with a Y-axis direction. That is, the line-shaped mask patterns 870 may perpendicularly intersect the first line-shaped stack structures 1700. Each of the line-shaped mask patterns 870 may include a photoresist layer or a hard mask layer.

Figure 20A:
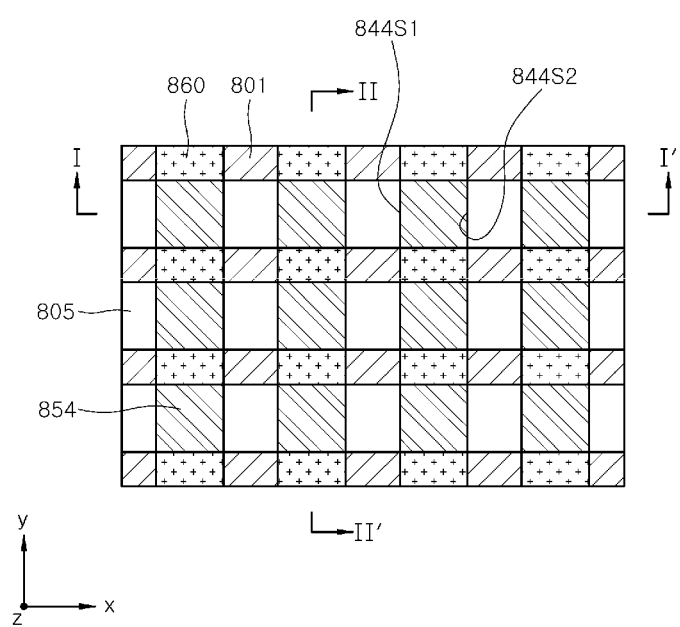
Figure 20B:
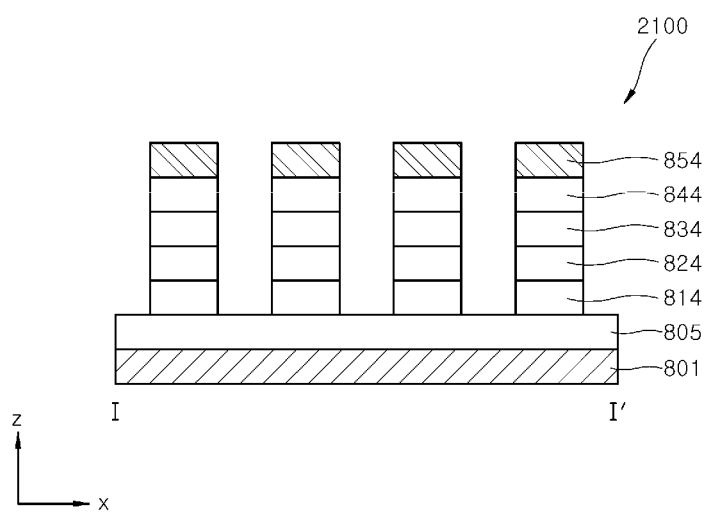
Figure 20C:
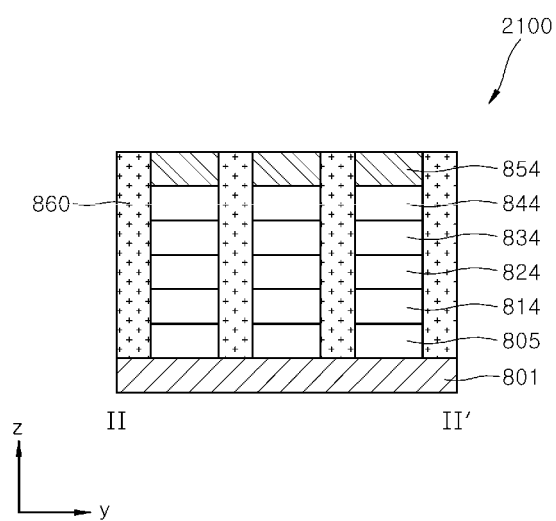

Referring to FIGS. 20A, 20B, and 20C, the upper electrode line 852, the insulation line 842, the middle electrode line 832, the resistive memory line 822, and the lower electrode line 812 may be etched using the line-shaped mask patterns 870 as etch masks, thereby forming a plurality of pillar-shaped structures 2100. As a result, two opposite sidewalls 844S1 and 844S2 of each of the pillar-shaped structures 2100 in the X-axis direction may be exposed.

Each of the pillar-shaped structures 2100 may include a lower electrode 814, a resistive memory layer pattern 824, a middle electrode 834, an insulation layer pattern 844 and an upper electrode 854, which are sequentially stacked on any one of the lower conductive lines 805.

Figure 21A:
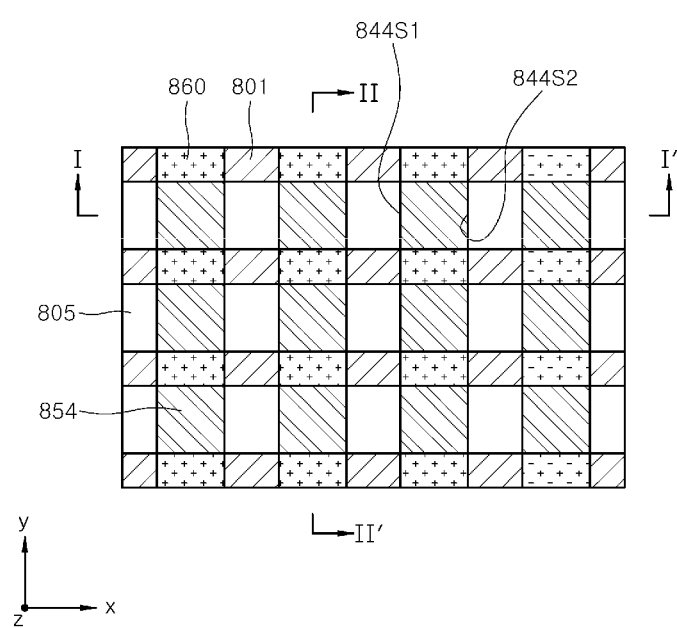
Figure 21B:
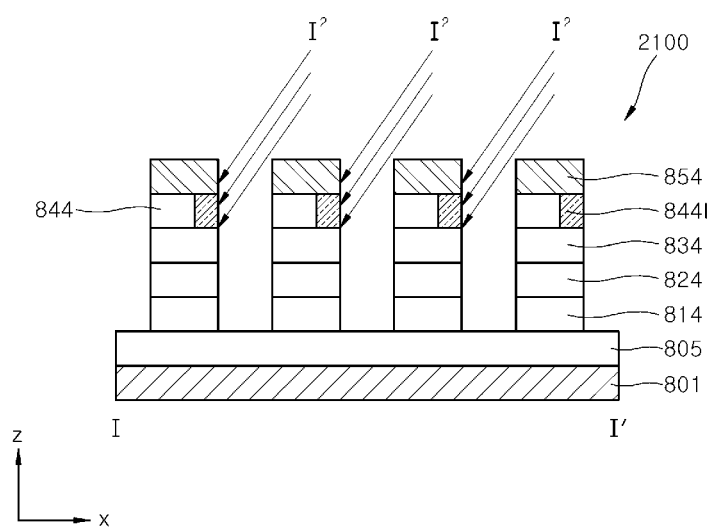
Figure 21C:
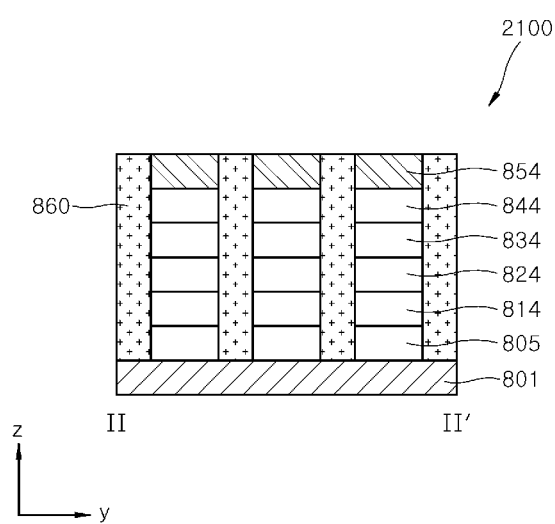

Referring to FIGS. 21A, 21B, and 21C, a tilted doping process may be applied to at least one of the exposed two opposite sidewalls 844S1 and 844S2 of each of the pillar-shaped structures 2100. As a result of the tilted doping process, dopants may be injected into at least a portion of each of the insulation layer patterns 844, which forms a threshold switching operation region 8441 in each insulation layer pattern 844. The tilted doping process of the third embodiment may be substantially the same as the tilted doping process of the first embodiment described with reference to FIGS. 10A, 10B, and 10C.

Figure 22A:
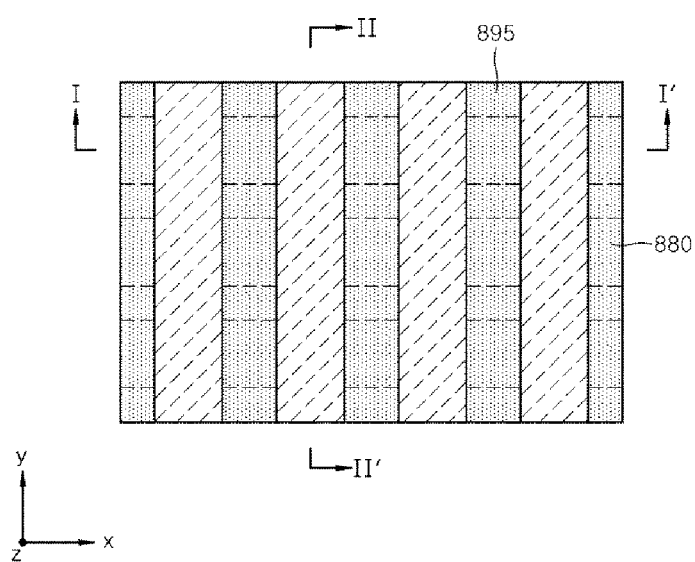
Figure 22B:
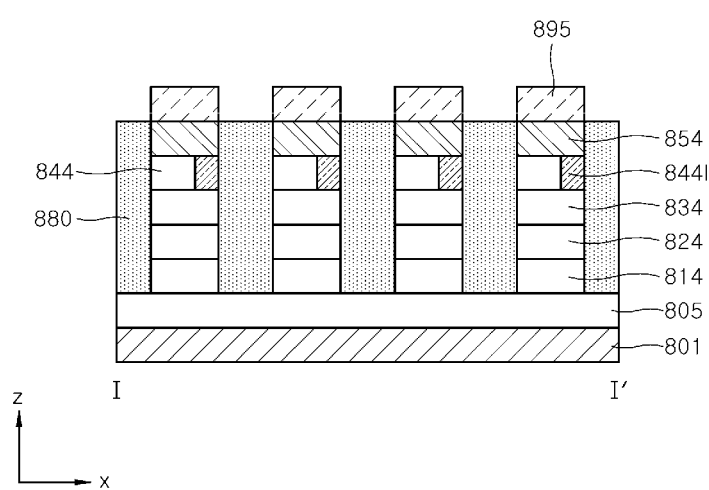
Figure 22C:
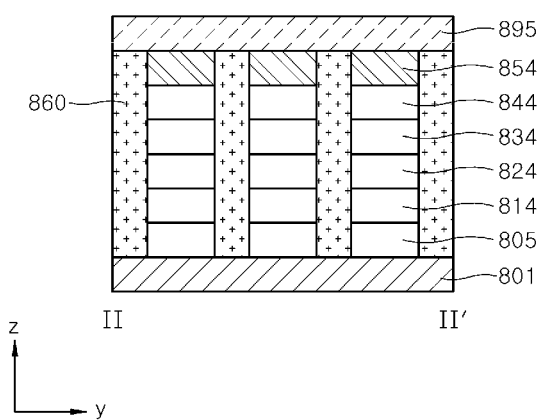

Referring to FIGS. 22A, 22B, and 22C, a second interlayer insulation layer 880 may be formed to fill spaces between the pillar-shaped structures 2100. Subsequently, a plurality of upper conductive lines 895 may be formed on the upper electrodes 854 and the second interlayer insulation layer 880. The upper conductive lines 895 may be parallel with the Y-axis direction.

As such, a ReRAM device may be fabricated by the above processes according to the third embodiment. The ReRAM device may include the lower conductive lines 805 and the upper conductive lines 895, which are nonparallel with the lower conductive lines 805. In addition, the ReRAM device may include the pillar-shaped structures 2100 respectively located at cross points of the lower conductive lines 805 and the upper conductive lines 895. Each of the pillar-shaped structures 2100 may include a variable resistive element and a selection element, which are stacked. The variable resistive element may include the lower electrode 814, the resistive memory layer pattern 824, and the middle electrode 834. The selection element may include the middle electrode 834, the insulation layer pattern 844 in which the threshold switching operation region 8441 is formed, and the upper electrode 854.

FIGS. 23A, 24A, 25A, and 26A are plan views illustrating a method of manufacturing a resistive random access memory (ReRAM) device according to a fourth embodiment. FIGS. 23B, 24B, 25B, and 26B are cross-sectional views taken along a line I-I' of FIGS. 23A, 24A, 25A, and 26A, respectively. FIGS. 23C, 24C, 25C, and 26C are cross-sectional views taken along a line II-II' of FIGS. 23A, 24A, 25A, and 26A, respectively.

First, a plurality of first line-shaped stack structures 2300 and the first interlayer insulation layer 860 filling spaces between the first line-shaped stack structures 2300 may be formed on the substrate 801 using substantially the same processes as described with reference to FIGS. 16A to 16C, 17A to 17C, 18A to 18C, and 19A to 19C of the third embodiment. In the fourth embodiment, each of the first line-shaped stack structures 2300 may include the lower conductive line 805, the lower electrode line 812, the insulation line 842, the middle electrode line 832, the resistive memory line 822, and the upper electrode line 852, which are sequentially stacked on the substrate 801.

Subsequently, the line-shaped mask patterns 870 may be formed on the first interlayer insulation layer 860 and the upper electrode lines 852, and may be parallel with the Y-axis direction. Each of the line-shaped mask patterns 870 may include a photoresist layer or a hard mask layer.

Figure 23A:
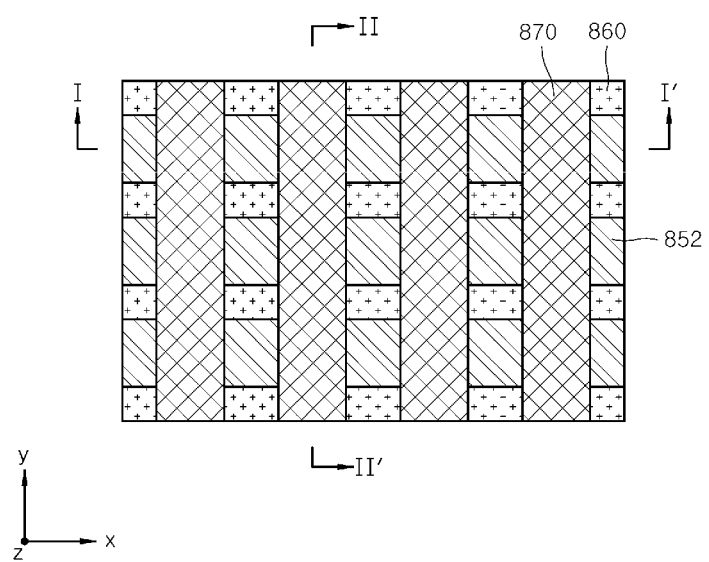
FIGS. 23A, 24A, 25A, and 26A are plan views illustrating a method of manufacturing a resistive random access memory (ReRAM) device according to a fourth embodiment.
Figure 23B:
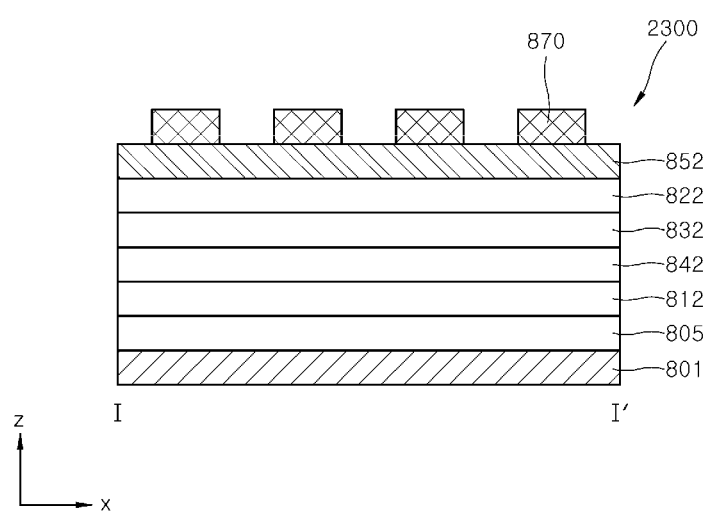
FIGS. 23B, 24B, 25B, and 26B are cross-sectional views taken along a line I-I' of FIGS. 23A, 24A, 25A, and 26A, respectively.
Figure 23C:
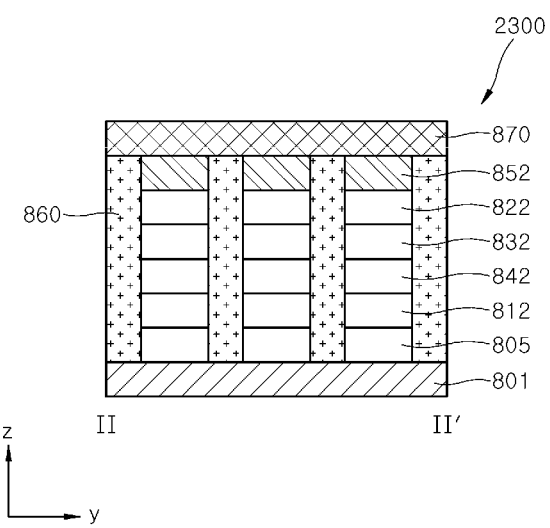
FIGS. 23C, 24C, 25C, and 26C are cross-sectional views taken along a line II-II' of FIGS. 23A, 24A, 25A, and 26A, respectively.

Meanwhile, as illustrated in FIGS. 23B and 23C, each of the first line-shaped stack structures 2300 may be different than each of the first line-shaped stack structures 1700 illustrated in FIGS. 17B and 17C. That is, in the fourth embodiment, the insulation line 842 and the resistive memory line 822 may be stacked in a different sequence than the sequence illustrated in FIGS. 17B and 17C of the third embodiment.

Figure 24A:
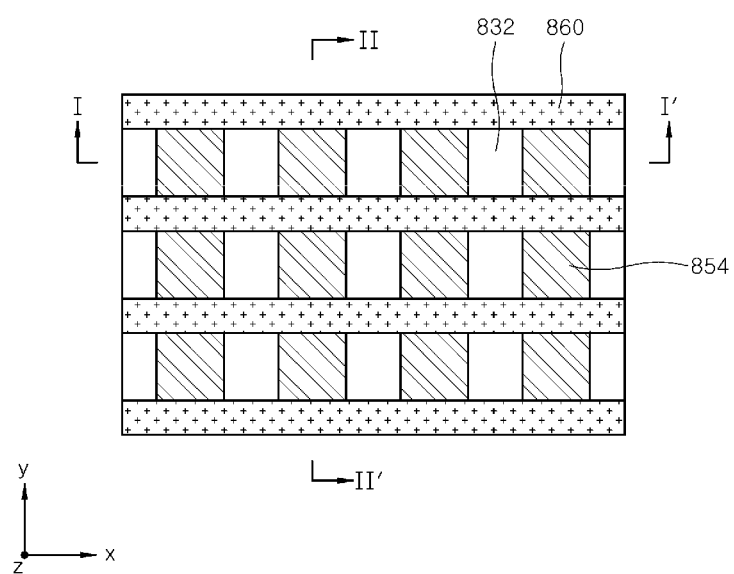
Figure 24B:
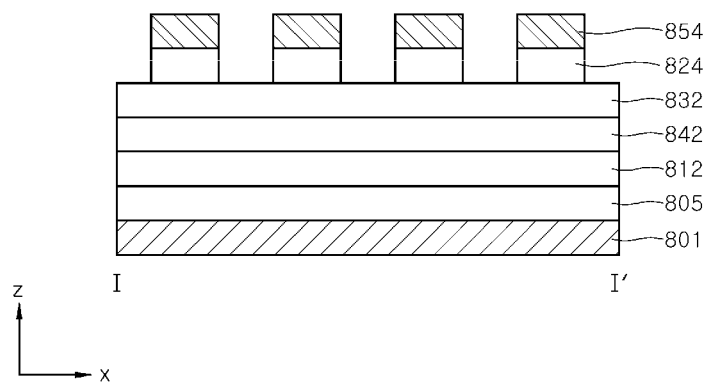
Figure 24C:
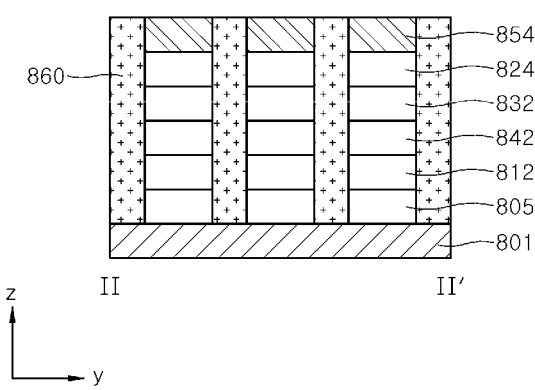

Referring to FIGS. 24A, 24B, and 24C, the upper electrode line 852 and the resistive memory line 822 may be etched using the line-shaped mask patterns 870 as etch masks, thereby forming a plurality of upper pillar-shaped structures. Each of the upper pillar-shaped structures may include a resistive memory layer pattern 824 and an upper electrode 854 which are sequentially stacked on any one of the middle electrode lines 832.

Figure 25A:
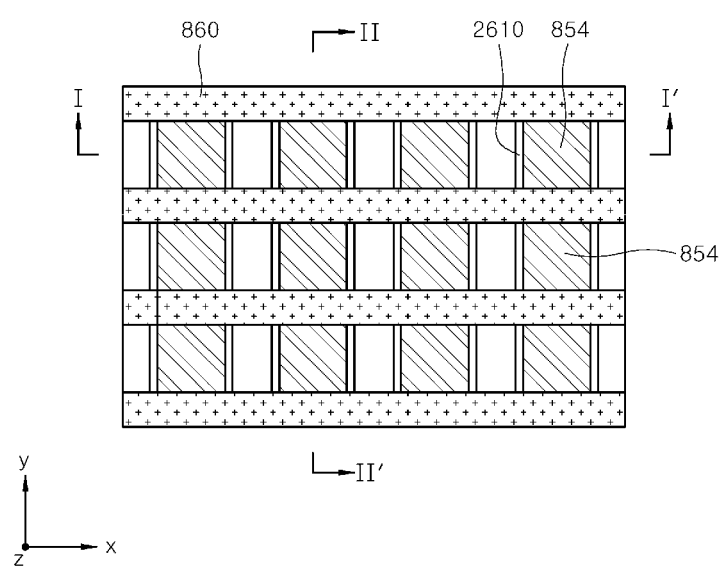
Figure 25B:
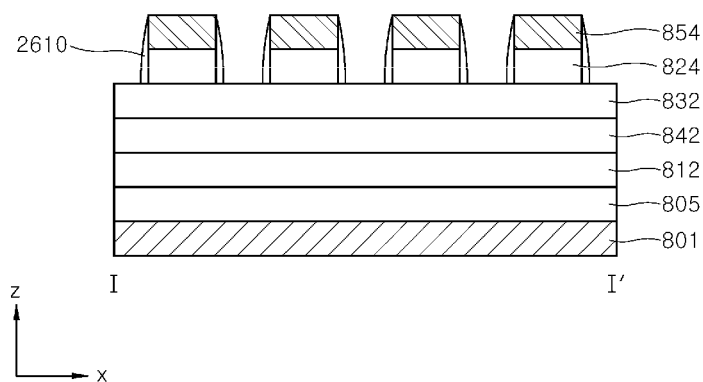
Figure 25C:
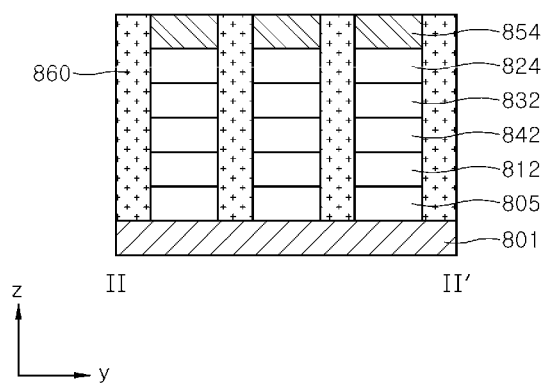

Referring to FIGS. 25A, 25B, and 25C, spacers 2610 may be formed on two opposite sidewalls of the resistive memory layer patterns 824 and two opposite sidewalls of the upper electrodes 854 in an X-axis direction. In an alternate embodiment, the spacers 2610 may cover the sidewalls of the resistive memory layer patterns 824 without covering the sidewalls of the upper electrodes 854.

The spacers 2610 may be formed of a material having a different etch selectivity than the lower electrode line 812, the insulation line 842, and the middle electrode line 832.

The spacers 2610 may function as protection layers or doping suppression layers during an ion implantation process which is performed in a subsequent step. The spacers 2610 may include an amorphous compound material.

Figure 26A:
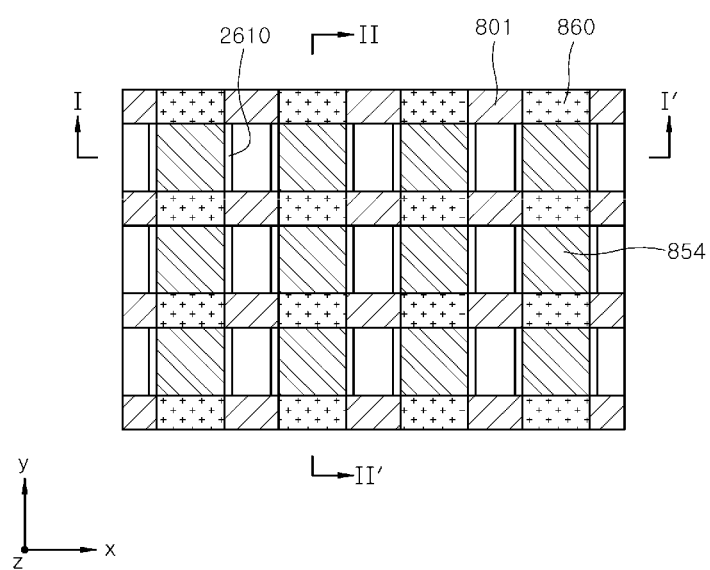
Figure 26B:
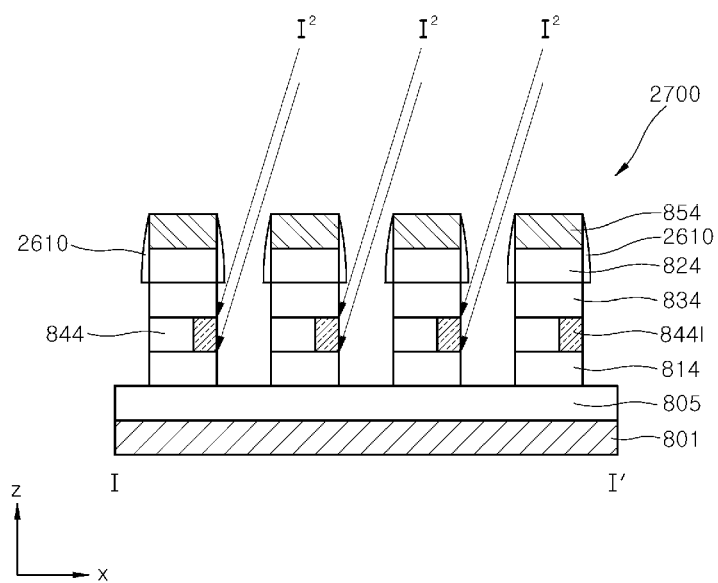
Figure 26C:
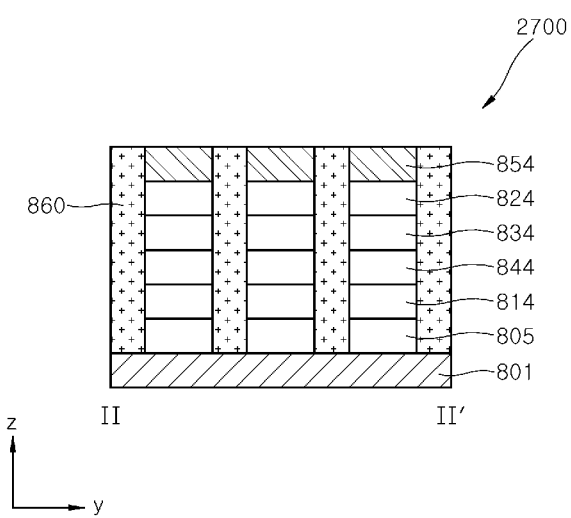

Referring to FIGS. 26A, 26B, and 26C, the middle electrode lines 832, the insulation lines 842, and the lower electrode lines 812 may be patterned to form a plurality of lower pillar-shaped structures. Each of the lower pillar-shaped structures may be formed to include a lower electrode 814, an insulation layer pattern 844, and a middle electrode 834, which are sequentially stacked on any one of the lower conductive lines 805. A plurality of pillar-shaped structures 2700 may include the lower pillar-shaped structures and the upper pillar-shaped structures.

Subsequently, a tilted doping process may be applied to the pillar-shaped structures 2700 to inject dopants into at least a portion of each of the insulation layer patterns 844. In some embodiments, the tilted doping process may be performed using a tilted ion implantation process, in which dopants $I^2$ are implanted into the insulation layer patterns 844 at an angle. In such a case, the spacers 2610 may function as protection layers for preventing the resistive memory layer patterns 824 from being physically damaged during the tilted ion implantation process. Moreover, the spacers 2610 may block the dopants $I^2$ from being injected into the resistive memory layer patterns 824 during the tilted ion implantation process. Thus, the spacers 2610 may prevent the tilted ion implantation process from changing an electrical property of the resistive memory layer patterns 824.

As a result of the tilted doping process, a threshold switching operation region 8441 may be formed in each of the insulation layer patterns 844. A size of the threshold switching operation regions 8441 may be controlled by controlling a size of a distribution region containing the dopants injected into each of the insulation layer patterns 844 during the tilted doping process.

Subsequently, although not shown in the drawings, a second interlayer insulation layer and a plurality of upper conductive lines may be formed using the same processes as described with reference to FIGS. 22A, 22B, and 22C. As such, a ReRAM device may be fabricated by the above processes according to the fourth embodiment. The ReRAM device fabricated by the fourth embodiment may have substantially the same configuration and structure as the ReRAM device fabricated by the third embodiment, except the resistive memory layer patterns 824 and the insulation layer patterns 844 including the threshold switching operation regions 8441 may be formed in different locations than the ReRAM device fabricated by the third embodiment.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A switching element comprising:
   a pillar-shaped structure including a first electrode, a second electrode and an insulation layer between the first electrode and the second electrode; and
   a threshold switching operation region disposed in the insulation layer, the threshold switching operation region including dopants and extending from a sidewall of the insulation layer to an inside region of the insulation layer, the threshold switching operation region being smaller than the insulation layer,
   wherein a size of the threshold switching operation region is controlled by controlling a size of a distribution region containing the dopants.

2. The switching element of claim 1, wherein the threshold switching operation region is distributed from an interface between the insulation layer and the first electrode to an interface between the insulation layer and the second electrode.

3. The switching element of claim 1, wherein at least one of a top surface and a bottom surface of the threshold switching operation region is located in a bulk region of the insulation layer.

4. The switching element of claim 1, wherein the insulation layer includes at least one selected from the group consisting of a silicon oxide material, a silicon nitride material, a metal oxide material, and a metal nitride material.

5. A resistive random access memory (ReRAM) device comprising:
   a pillar-shaped structure including a lower electrode, a resistive memory layer pattern, a middle electrode, an insulation layer pattern, and an upper electrode, which are sequentially stacked; and
   a threshold switching operation region disposed in the insulation layer pattern and extending from a sidewall of the insulation layer pattern to an inside region of the insulation layer pattern, the threshold switching operation region being smaller than the insulation layer pattern,
   wherein the threshold switching operation region includes dopants, and
   wherein a size of the threshold switching operation region corresponds to a size of a distribution region containing the dopants.

6. The ReRAM device of claim 5, wherein the threshold switching operation region is distributed from an interface between the insulation layer pattern and the middle electrode to an interface between the insulation layer pattern and the upper electrode.

7. The ReRAM device of claim 5, wherein at least one of a top surface and a bottom surface of the threshold switching operation region is located in a bulk region of the insulation layer pattern.

8. The switching element of claim 1, wherein the threshold switching operation region has a smaller width than the insulation layer.

9. The switching element of claim 1, wherein the insulation layer includes a portion without the dopants.

10. The switching element of claim 1, wherein the threshold switching operation region has a non-memory characteristic.

11. The ReRAM device of claim 5, wherein the threshold switching operation region has a smaller width than the insulation layer pattern.

12. The ReRAM device of claim 5, wherein the insulation layer pattern includes a portion without the dopants.

13. The ReRAM device of claim 5, wherein threshold switching operation region has a non-memory characteristic.

* * * * *